US010636356B1

(12) United States Patent
Qian et al.

(10) Patent No.: US 10,636,356 B1
(45) Date of Patent: Apr. 28, 2020

(54) DISPLAYS WITH GATE DRIVER CIRCUITRY HAVING SHARED REGISTER CIRCUITS

(71) Applicant: Apple Inc., Cupertino, CA (US)

(72) Inventors: Chuang Qian, Santa Clara, CA (US); Tsung-Ting Tsai, Cupertino, CA (US); Shyuan Yang, Burlingame, CA (US); Cheng-Chih Hsieh, Santa Clara, CA (US); Abbas Jamshidi Roudbari, San Jose, CA (US); Ting-Kuo Chang, San Jose, CA (US); Shih-Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/534,946

(22) Filed: Aug. 7, 2019

(30) Foreign Application Priority Data

Aug. 2, 2019 (CN) .......................... 2019 1 0712810

(51) Int. Cl.
G09G 3/3233 (2016.01)
G11C 19/28 (2006.01)
G09G 3/3275 (2016.01)
G09G 3/3266 (2016.01)

(52) U.S. Cl.
CPC ......... *G09G 3/3233* (2013.01); *G09G 3/3266* (2013.01); *G09G 3/3275* (2013.01); *G11C 19/28* (2013.01); *G09G 2310/0286* (2013.01)

(58) Field of Classification Search
CPC .. G09G 3/3233; G09G 3/3266; G09G 3/3275; G09G 2310/0286; G11C 19/28
See application file for complete search history.

(56) References Cited

U.S. PATENT DOCUMENTS

| 7,129,918 | B2 | 10/2006 | Kimura |
| 7,605,793 | B2 | 10/2009 | Lee |
| 8,022,920 | B2* | 9/2011 | Kim .................. G09G 3/006 |
|           |    |         | 315/169.3 |
| 8,471,875 | B2 | 6/2013 | Chaji et al. |
| 8,674,905 | B2 | 3/2014 | Eom et al. |

(Continued)

FOREIGN PATENT DOCUMENTS

| CN | 1766972 A | 5/2006 |
| CN | 101256735 A | 9/2008 |

(Continued)

*Primary Examiner* — Peter D McLoone
(74) *Attorney, Agent, or Firm* — Treyz Law Group, P.C.; Joseph F. Guihan

(57) ABSTRACT

Electronic devices may include displays having organic light-emitting diode pixels, display driver circuitry, and gate driver circuitry. To reduce the amount of space occupied in the inactive area of a display by the gate driver circuitry, one or more of the shift registers in the gate driver circuitry may include register circuits that are shared by multiple rows of pixels. Different drivers may use different clock frequencies to ensure synchronous operation of the display even when some register circuits share pixel rows. For increased flexibility in the arrangement of the register circuits in the shift registers, one or more of the shift registers may be split across the active area of the display. In some cases, one of the emission drivers may be omitted from the gate driver circuitry and a single emission driver may provide multiple emission control signals for the pixels.

16 Claims, 19 Drawing Sheets

(56) References Cited

U.S. PATENT DOCUMENTS

| | | | |
|---|---|---|---|
| 9,293,093 B2 | 3/2016 | Kim et al. | |
| 9,595,546 B2 * | 3/2017 | Kim | H01L 29/78606 |
| 10,373,557 B2 * | 8/2019 | Zhu | H01L 27/3248 |
| 2008/0246697 A1 * | 10/2008 | Kim | G09G 3/006 |
| | | | 345/76 |
| 2015/0077407 A1 | 3/2015 | Kim et al. | |
| 2016/0240565 A1 * | 8/2016 | Kim | H01L 29/78606 |
| 2017/0301293 A1 * | 10/2017 | Zhu | G09G 3/3258 |
| 2019/0139496 A1 * | 5/2019 | Peng | G09G 3/3233 |

FOREIGN PATENT DOCUMENTS

| | | |
|---|---|---|
| CN | 101630479 A | 1/2010 |
| CN | 103268753 A | 8/2013 |
| CN | 107808625 A | 3/2018 |
| CN | 109410832 A | 3/2019 |
| CN | 110176215 A | 8/2019 |
| CN | 209265989 U | 8/2019 |

* cited by examiner

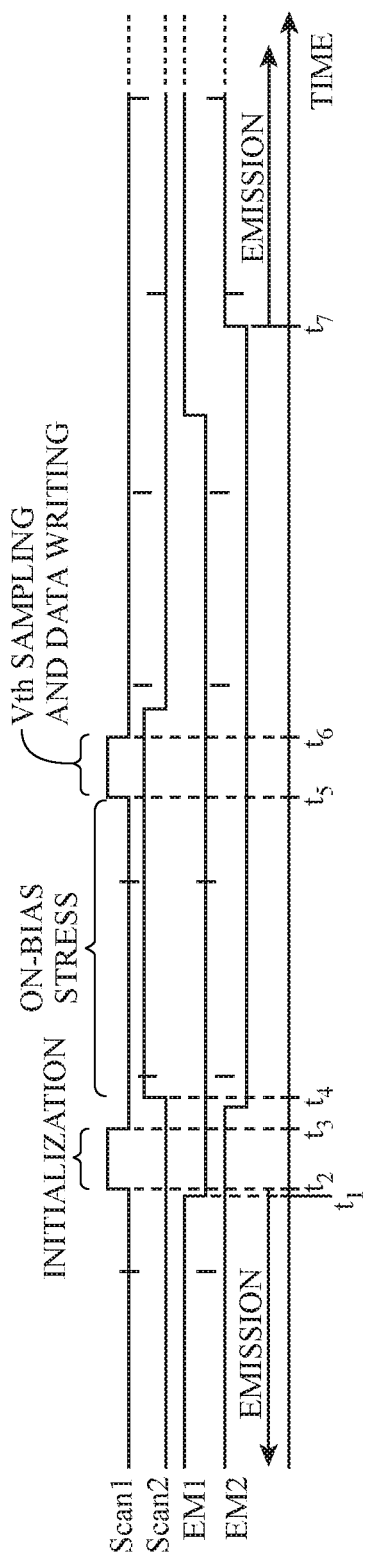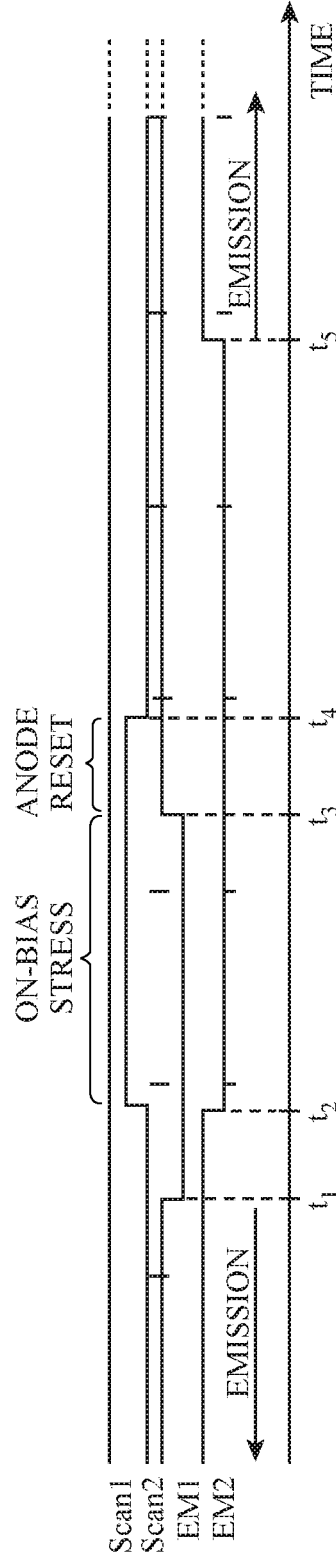

US 10,636,356 B1

DISPLAYS WITH GATE DRIVER CIRCUITRY HAVING SHARED REGISTER CIRCUITS

This application claims priority to CN patent application No. 201910712810.2, filed on Aug. 2, 2019, which is hereby incorporated by reference herein in its entirety.

BACKGROUND

This relates generally to displays, and, more particularly, to displays with gate driver circuitry.

Electronic devices often include displays. For example, cellular telephones and portable computers include displays for presenting information to users. An electronic device may have an organic light-emitting diode display based on organic-light-emitting diode pixels or a liquid crystal display based on liquid crystal pixels.

Displays may include driving circuitry that is used to provide signals to the display to operate the display. If care is not taken, the driving circuitry may have a larger than desired footprint and may undesirably increase the size of an inactive border region of the display.

It would therefore be desirable to be able to provide improved driver circuitry for electronic device displays.

SUMMARY

An electronic device may include a display such as a light-emitting diode display. The electronic device may be a wristwatch device.

Displays may be operable in a normal refresh rate mode and in a low refresh rate mode. The refresh rate during the normal refresh rate mode may be 60 Hz. The refresh rate mode during the low refresh rate mode may be 1 Hz. During the normal refresh rate mode, refresh frames may be used to update the data displayed by the pixels. During the low refresh rate mode, anode reset frames may be used intermittently in between refresh frames to reduce luminance artifacts.

The display may include an array of pixels formed in an active area of the display, display driver circuitry formed in an inactive area of the display that is configured to provide image data to the pixels, and gate driver circuitry formed in the inactive area of the display. The gate driver circuitry may include one or more drivers formed by shift registers that include a plurality of register circuits. The gate driver circuitry may include first and second scan drivers and first and second emission drivers.

To reduce the amount of space occupied in the inactive area of the display by the gate driver circuitry, one or more of the shift registers may include register circuits that are shared by multiple rows of pixels. In one arrangement, a second scan driver may have one register circuit for each row of pixels, whereas a first scan driver, a first emission driver, and a second emission driver may include register circuits that are each shared by at least two rows of pixels in the active area. Different drivers may use different clock frequencies to ensure synchronous operation of the display.

For increased flexibility in the arrangement of the register circuits in the shift registers, one or more of the shift registers may be split across the active area. For example, a shift register may scan the pixels from the top of the active area to the bottom of the active area. However, at least one register circuit of the shift register may be formed on the left side of the active area and at least one register circuit of the shift register may be formed on the right side of the active area.

In some cases, one of the emission drivers may be omitted from the gate driver circuitry. A single emission driver may provide multiple emission control signals for the pixels. A register circuit of the emission driver may have an output that is provided to a first emission control transistor in two corresponding rows of pixels. The output may also be provided to a second emission control transistor in the two preceding rows of pixels.

BRIEF DESCRIPTION OF THE DRAWINGS

FIG. 8 is a timing diagram showing illustrative signals provided by the gate driver circuitry of FIG. 4 for a refresh frame in accordance with an embodiment.

FIG. 9 is a timing diagram showing illustrative signals provided by the gate driver circuitry of FIG. 4 for an anode reset frame in accordance with an embodiment.

DETAILED DESCRIPTION

Figure 1:
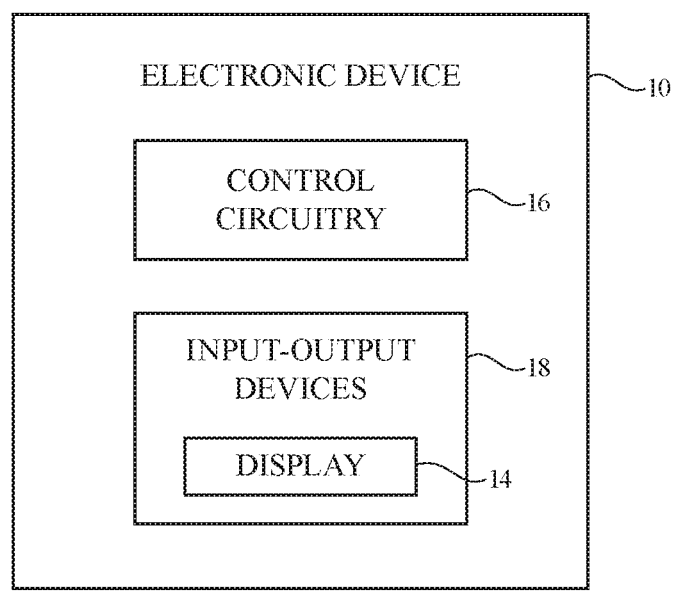
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be an organic light-emitting diode display, a display formed from an array of discrete light-emitting diodes each formed from a crystalline semiconductor die, or any other suitable type of display. Configurations in which the pixels of display 14 include light-emitting diodes are sometimes described herein as an example. This is, however, merely illustrative. Any suitable type of display may be used for device 10, if desired (e.g., a liquid crystal display).

In some cases, electronic device 10 may be a wristwatch device. Display 14 of the wristwatch device may be positioned in a housing. A wristwatch strap may be coupled to the housing.

Figure 2:
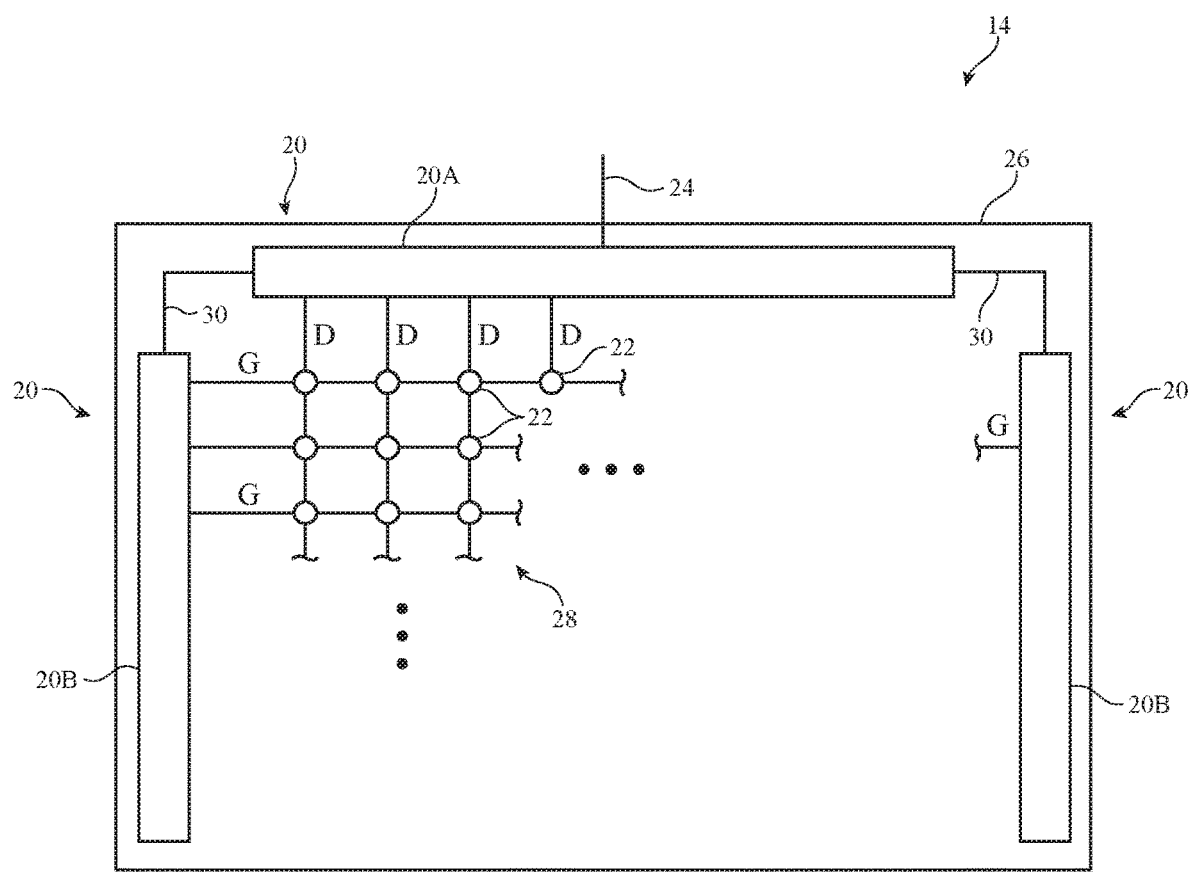
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 (sometimes referred to as active area 28) may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. If desired, a backlight unit may provide backlight illumination for display 14.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 in an inactive area of the display as shown in FIG. 2. Gate driver circuitry 20B may include gate drivers and emission drivers.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, the control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D (e.g., vertical signal lines) while issuing control signals to supporting display driver circuitry such as gate driver circuitry 20B over signal paths 30. With the illustrative arrangement of FIG. 2, data lines D run vertically through display 14 and are associated with respective columns of pixels 22. During compensation operations, column driver circuitry 20 may use paths such as data lines D to supply a reference voltage.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.). The number of horizontal signal lines in each row may be determined by the number of transistors in the display pixels 22 that are being controlled independently by the horizontal signal lines. Display pixels of different configurations may be operated by different numbers of control lines, data lines, power supply lines, etc.

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Figure 3:
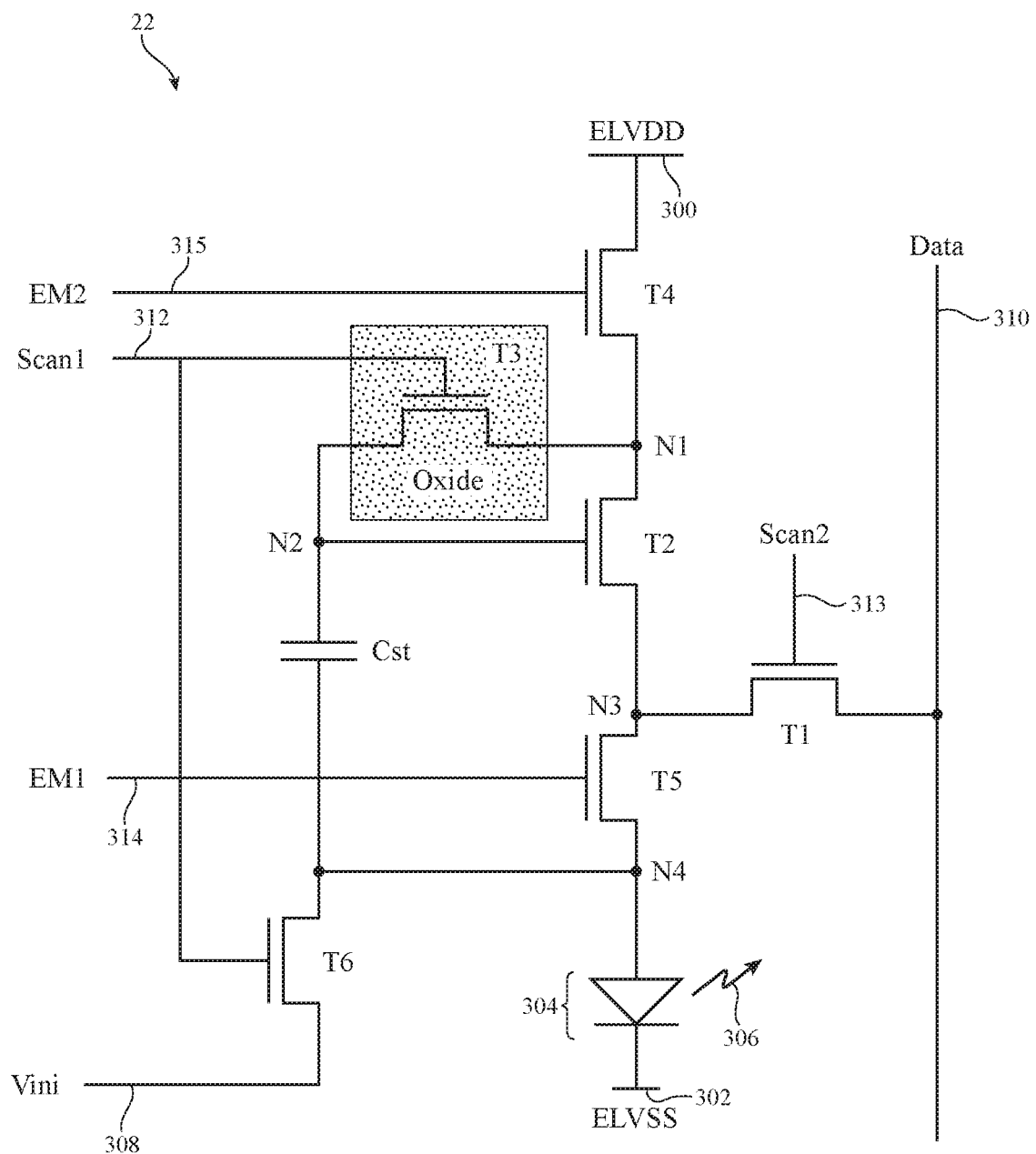
FIG. 3 is a diagram of an illustrative pixel circuit in accordance with an embodiment.

An illustrative pixel circuit of the type that may be used for each pixel 22 in array 28 is shown in FIG. 3. As shown in FIG. 3, display pixel 22 may include a storage capacitor Cst and transistors such as n-type (i.e., n-channel) transistors T1, T2, T3, T4, T5, and T6. The transistors of pixel 22 may be thin-film transistors formed from a semiconductor such as silicon (e.g., polysilicon deposited using a low temperature process, sometimes referred to as LTPS or low-temperature polysilicon), semiconducting oxide (e.g., indium gallium zinc oxide (IGZO)), or other suitable semiconductor material. In other words, the active region and/or the channel region of these thin-film transistors may be formed from polysilicon or semi-conducting oxide material.

Display pixel 22 may include light-emitting diode 304. A positive power supply voltage ELVDD (e.g., 1 V, 2 V, more than 1 V, 0.5 to 5 V, 1 to 10 V, or other suitable positive voltage) may be supplied to positive power supply terminal 300 and a ground power supply voltage ELVSS (e.g., 0 V, −1 V, −2 V, or other suitable negative voltage) may be supplied to ground power supply terminal 302. The power supply voltages ELVDD and ELVSS may be provided to terminals 300 and 302 from respective power supply traces. For example, a conductive layer may serve as a ground power supply voltage trace that provides the ground power supply voltage ELVSS to all of the pixels within the display. The state of transistor T2 controls the amount of current flowing from terminal 300 to terminal 302 through diode 304 and therefore controls the amount of emitted light 306 from display pixel 22. Transistor T2 is therefore sometimes referred to as the "drive transistor." Diode 304 may have an associated parasitic capacitance COLED (not shown).

Terminal 308 is used to supply an initialization voltage Vini (e.g., a positive voltage such as 1 V, 2 V, less than 1 V, 1 to 5 V, or other suitable voltage) to assist in turning off diode 304 when diode 304 is not in use. Control signals from display driver circuitry such as gate driver circuitry 20B of FIG. 2 are supplied to control terminals such as terminals 312, 313, 314, and 315. Terminals 312 and 313 may serve respectively as first and second scan control terminals, whereas terminals 314 and 315 may serve respectively as first and second emission control terminals. Scan control signals Scan1 and Scan2 may be applied to scan terminals 312 and 313, respectively. Emission control signals EM1 and EM2 may be supplied to terminals 314 and 315, respectively. A data input terminal such as data signal terminal 310 is coupled to a respective data line D of FIG. 2 for receiving image data for display pixel 22.

Transistors T4, T2, T5, and diode 304 may be coupled in series between power supply terminals 300 and 302. In particular, transistor T4 has a drain terminal that is coupled to positive power supply terminal 300, a gate terminal that receives emission control signal EM2, and a source terminal (labeled as node N1) coupled to transistors T2 and T3. The terms "source" and "drain" terminals of a transistor can sometimes be used interchangeably. Drive transistor T2 has a drain terminal that is coupled to node N1, a gate terminal coupled to node N2, and a source terminal coupled to node N3. Transistor T5 has a drain terminal that is coupled to node N3, a gate terminal that receives emission control signal EM1, and a source terminal coupled to node N4. Node N4 is coupled to ground power supply terminal 302 via organic light-emitting diode 304.

Transistor T3, capacitor Cst, and transistor T6 are coupled in series between node N1 and terminal 308. In particular, transistor T3 has a drain terminal that is coupled to node N1, a gate terminal that receives scan control signal Scan1 from scan line 312, and a source terminal that is coupled to node N2. Storage capacitor Cst has a first terminal that is coupled to node N2 and a second terminal that is coupled to node N4. Transistor T6 has a drain terminal that is coupled to node N4, a gate terminal that receives scan control signal Scan1 via scan line 312, and a source terminal that receives initialization voltage Vini via terminal 308.

Transistor T1 has a drain terminal that receives a data signal via data line 310, a gate terminal that receives scan control signal Scan2 via scan line 313, and a source terminal that is coupled to node N3. Connected in this way, emission control signal EM2 may be asserted to enable transistor T4 (e.g., signal EM2 may be driven to a high voltage level to turn on transistor T4); emission control signal EM1 may be asserted to activate transistor T5; scan control signal Scan2 may be asserted to turn on transistor T1; and scan control signal Scan1 may be asserted to simultaneously switch on transistors T3 and T6. Transistors T4 and T5 may sometimes be referred to as emission transistors. Transistor T6 may sometimes be referred to as an initialization transistor. Transistor T1 may sometimes be referred to as a data loading transistor.

In one suitable arrangement, transistor T3 may be implemented as a semiconducting-oxide transistor while remaining transistors T1, T2, and T4-T6 are silicon transistors. Semiconducting-oxide transistors exhibit relatively lower leakage than silicon transistors, so implementing transistor T3 as a semiconducting-oxide transistor will help reduce flicker at low refresh rates (e.g., by preventing current from leaking through T3 when signal Scan1 is deasserted or driven low).

The arrangement of pixel 22 in FIG. 3 is merely illustrative, and other desired pixel arrangements be used if desired. For example, each of transistors T1-T6 may be formed from semiconducting-oxide transistors or silicon transistors. The arrangement of the connections between the transistors may be changed if desired. One or more transistors may be omitted if desired. Additional transistors may be included in the pixel if desired.

Figure 4:
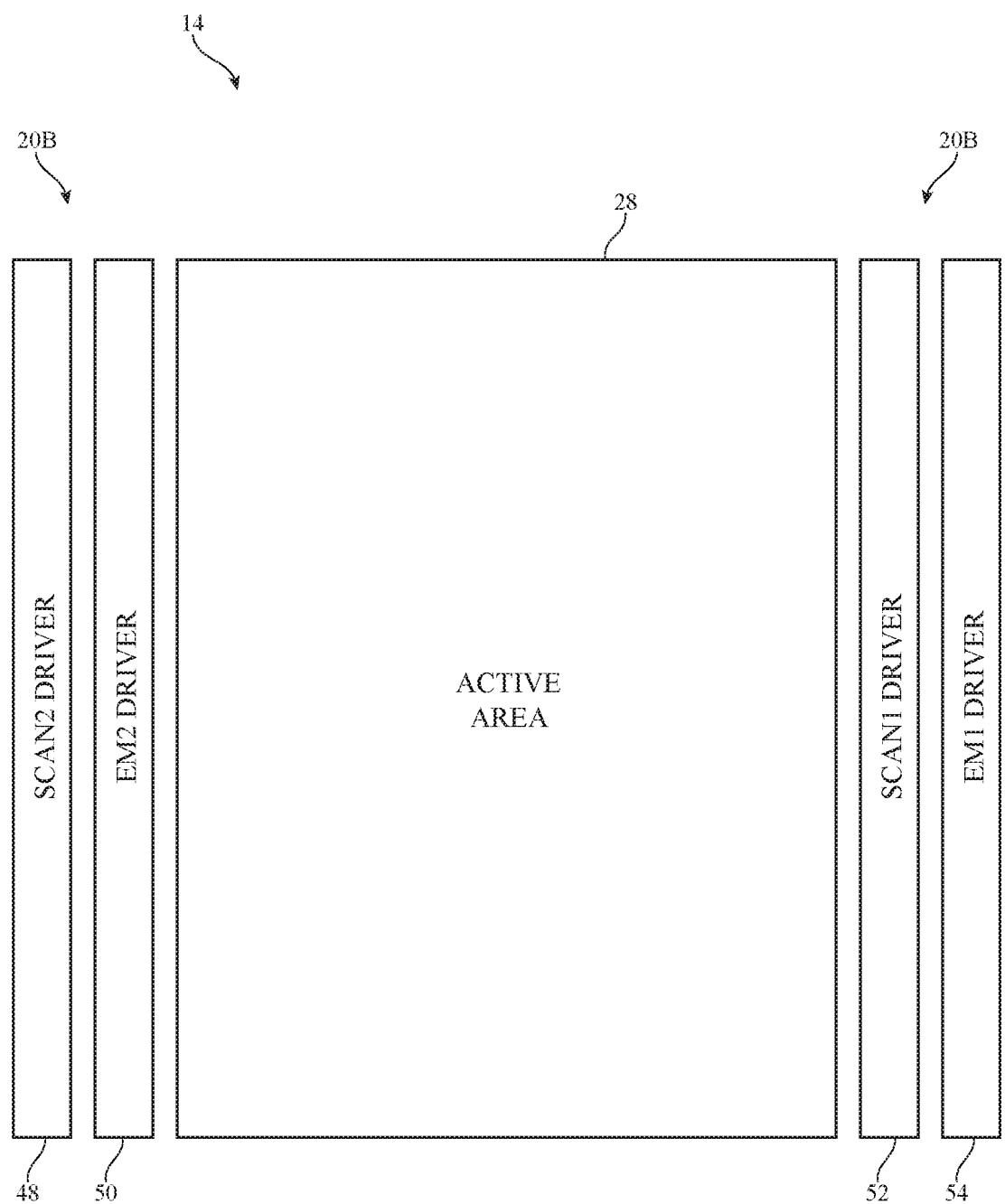
FIG. 4 is a top view of an illustrative display showing how the display's gate driver circuitry may include one or more gate drivers and one or more emission drivers in accordance with an embodiment.

FIG. 4 shows a top view of an illustrative display with gate driver circuitry that includes gate drivers and emission drivers. Gate driver circuitry 20B may be formed along one or more edges of display 14. FIG. 4 shows an example where gate driver circuitry 20B is formed on opposing sides of pixel array 28 (sometimes referred to as an active area).

For example, gate driver circuitry 20B may be arranged along the left and right sides of display 14. Gate driver circuitry 20B may include one or more gate drivers (sometimes referred to as scan drivers or scanning drivers) and one or more emission drivers on each side of the active area. FIG. 4 shows gate driver 48 and emission driver 50 on a first side of the active area and gate driver 52 and emission driver 54 on a second, opposing side of the display.

The gate drivers may be configured to supply control signals to each pixel in the display. For example, gate driver 48 may supply switching transistor control signal Scan2 to each pixel (e.g., at terminal 313 in FIG. 3). Emission driver 50 may supply emission control signal EM2 to each pixel (e.g., at terminal 315 in FIG. 3). Gate driver 52 may supply switching transistor control signal Scan1 to each pixel (e.g., at terminal 312 in FIG. 3). Emission driver 54 may supply emission control signal EM1 to each pixel (e.g., at terminal 314 in FIG. 3).

Each emission driver and scan driver (e.g., drivers 48, 50, 52, and 54 in FIG. 4) may contain a shift register formed from a chain of register circuits. Each register circuit may supply control signals (e.g., switching transistor control signals, emission enable signals, etc.) to a corresponding row of pixels. During operation, control circuitry 16 may initiate propagation of a control pulse through the shift register. As the control pulse propagates through the shift register, each gate line may be activated in sequence, allowing successive rows of pixels 22 to be loaded with data from data lines D. Each register circuit may be referred to as a stage of the shift register.

Figure 5:
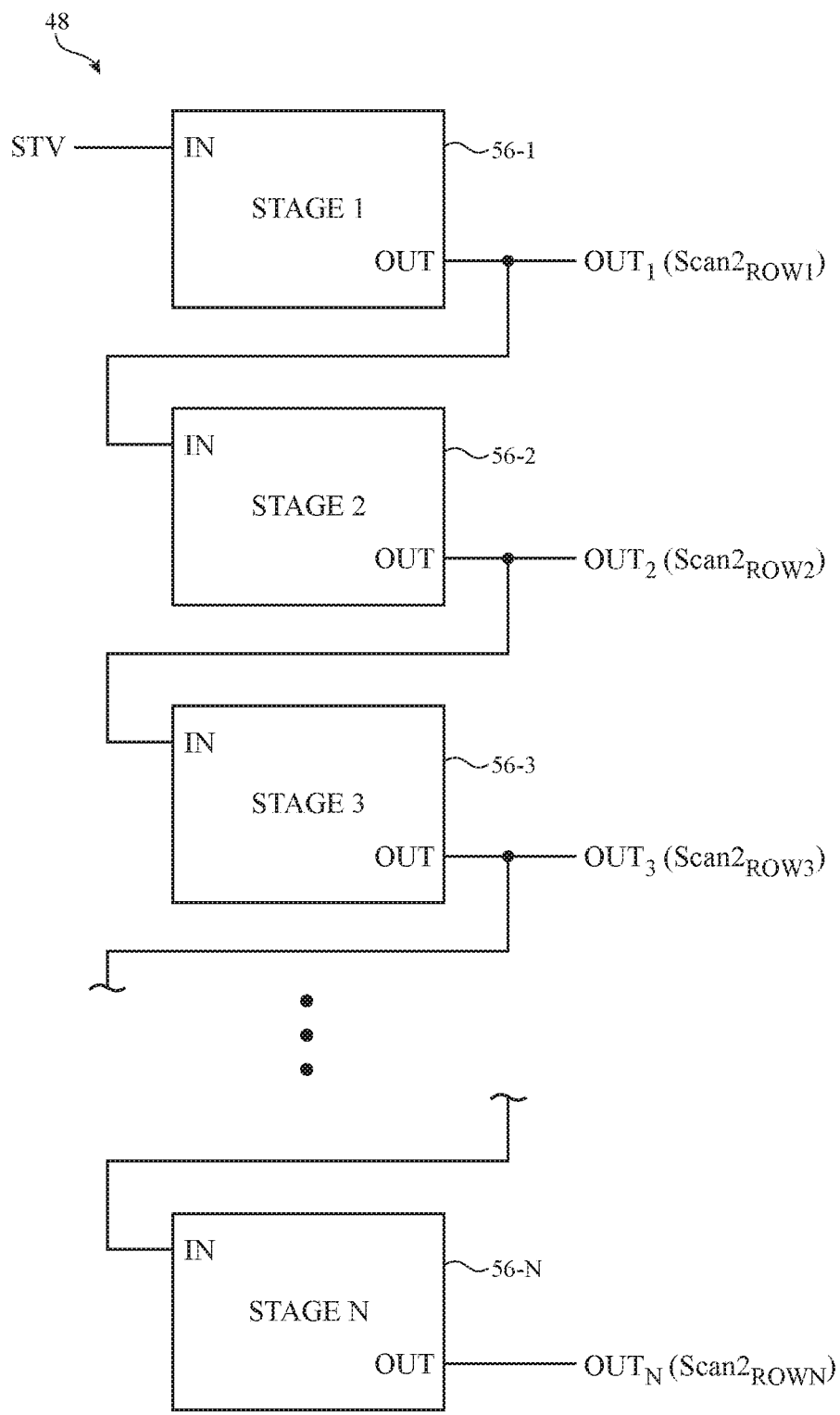
FIG. 5 is a schematic diagram of an illustrative shift register that may be used to form a gate driver or an emission driver for a display in accordance with an embodiment.

FIG. 5 is a schematic diagram of a shift register that may be used to form a gate driver such as gate driver 48 in FIG. 4. The shift register may include a chain of register circuits 56. Each register circuit may supply a horizontal control signal to a corresponding row of pixels. For example, a first register circuit 56-1 may have an output $OUT_1$ that is coupled to the first row of pixels in the display. The second register circuit 56-2 may have an output $OUT_2$ that is coupled to the second row of pixels in the display. The third register circuit 56-3 may have an output OUT3 that is coupled to the third row of pixels in the display. This pattern may continue until the last row of the display. Register circuit 56-N may be associated with the last row of pixels in the active area and may have an output $OUT_N$ that is coupled to the last row of pixels in the display. For gate driver 48, $OUT_1$ is the Scan2 signal for Row 1 (e.g., $Scan2_{ROW1}$), $OUT_2$ is the Scan2 signal for Row 2 (e.g., $Scan2_{ROW2}$), etc. For gate driver 52, $OUT_1$ would be the Scan1 signal for Row 1 (e.g., $Scan1_{ROW1}$), $OUT_2$ would be the Scan1 signal for Row 2 (e.g., $Scan1_{ROW2}$), etc. Any of drivers 48, 50, 52, and 54 may be formed from a shift register similar to as shown in FIG. 5.

The first stage (56-1) of the shift register may receive a start pulse (STV) at the input of the first stage. The output of each stage in the shift register may be coupled to the input of the subsequent stage, allowing the pulse (sometimes referred to as a control pulse) to be propagated through the shift register. For example, the control pulse STV may be provided to the first stage 56-1. This may activate the output of stage 56-1. The output of 56-1 is coupled to the input of stage 56-2, so when the output of 56-1 is activated, the input of 56-2 may be activated. The output of stage 56-2 may be coupled to the input of 56-3, and this pattern may be continued such that the control pulse STV may be propagated through each stage of the shift register to activate the output of each register circuit.

Figure 6:
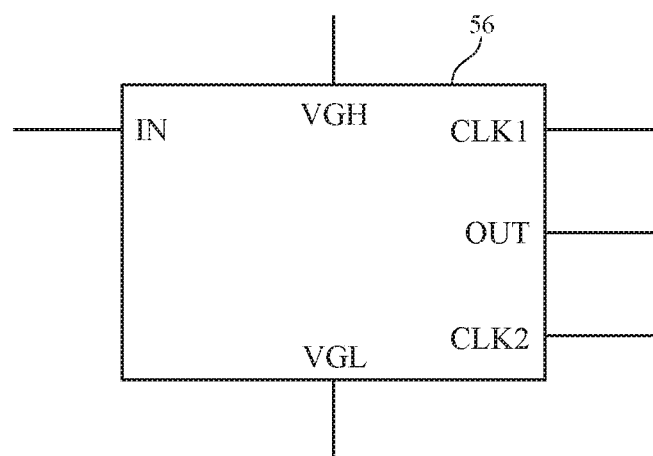
FIG. 6 is a schematic diagram of an illustrative register circuit that may be used in the shift register of FIG. 5 in accordance with an embodiment.

For simplicity, each register circuit in FIG. 5 is depicted as having a single input and a single output. However, each register circuit may have additional inputs and/or outputs as shown in FIG. 6. FIG. 6 shows a detailed view of a register circuit that may be used to form a shift register for drivers 48, 50, 52 or 54. The register circuit may include an input (IN) and an output (OUT). The input may be the output from the previous register circuit. The input of the first register circuit may be control pulse STV. The register circuit may also receive clock signals CLK1 and CLK2. Finally, each register circuit may receive first and second supply voltages VGH and VGL.

The shift register structure shown in FIGS. 5 and 6 was described as forming gate driver 48. However, this type of structure may also be used to form drivers 50, 52, and 54. The output signals for drivers 50, 52, and 54 will correspond to control signals EM2, Scan1, and EM1, respectively.

Display 14 may be configured to support multiple different refresh rates. For example, display 14 may be configured to support low refresh rate operations. Operating display 14 using a relatively low refresh rate (e.g., a refresh rate of 1 Hz, 2 Hz, 1-10 Hz, less than 100 Hz, less than 60 Hz, less than 30 Hz, less than 10 Hz, less than 5 Hz, less than 1 Hz, or other suitably low rate) may be suitable for applications outputting content that is static or nearly static and/or for applications that require minimal power consumption.

Figure 7:
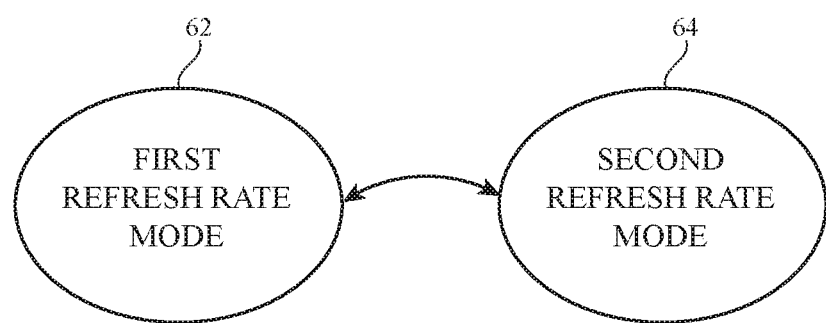
FIG. 7 is a state diagram showing illustrative refresh rate modes of a display in accordance with an embodiment.

FIG. 7 is a state diagram showing illustrative refresh rate modes for display 14. As shown, display 14 may be operable in both a first refresh rate mode 62 and a second refresh rate mode 64. Control circuitry 16 may identify which mode is to be used based on the type of content being displayed, the type of application outputting display content, etc. In the first refresh rate mode (sometimes referred to as a high refresh rate mode or normal refresh rate mode), the refresh rate of the display may be 60 Hz, 120 Hz, or another desired refresh rate. In the second refresh rate mode, the refresh rate (e.g., a second refresh rate) may be different than in the first refresh rate mode. For example, the second refresh rate may be less than 60 Hz (e.g., 1 Hz, 2 Hz, 1-10 Hz, less than 30 Hz, less than 10 Hz, less than 5 Hz, less than 1 Hz, etc.). The second refresh rate mode 64 may sometimes be referred to as low refresh rate mode 64.

The example of display 14 being operable in two refresh rate modes is merely illustrative. In general, display 14 may be operated at any desired refresh rate. The display may have three or more supported refresh rates, four or more supported refresh rates, etc. The refresh rate may vary within a given refresh rate mode if desired.

Herein, an example will be described where the refresh rate is 60 Hz in normal refresh rate mode 62 and the refresh rate is 1 Hz in low refresh rate mode 64. This example is merely illustrative and other desired refresh rates may be used if desired.

During 60 Hz operation, the data value of each pixel may be refreshed or updated in each frame. A refresh frame may refer to a frame where the data values of the pixels are updated. The refresh frame may have a duration of 16.67 milliseconds (ms). The data values of the pixels are updated every 16.67 milliseconds during 60 Hz operation.

As previously discussed, drivers 48, 50, 52, and 54 provide control signals Scan2, EM2, Scan1, and EM1 to display pixels 22. The drivers provide the control signals in a set sequence in order to operate the display pixels. FIG. 8 is a timing diagram that illustrates the operation of organic light-emitting diode display pixel 22 during a refresh frame.

As shown in FIG. 8, during the data refresh frame, display pixel 22 may be operated in at least four phases: (1) a reset/initialization phase, (2) an on-bias stress phase, (3) a threshold voltage sampling and data writing phase, and (4) an emission phase. FIG. 8 is a timing diagram showing relevant signal waveforms that may be applied to display pixel 22 during the four phases of the data refresh operation.

Prior to time t1, signals Scan1 and Scan2 are deasserted (e.g., the scan control signals are both at low voltage levels), whereas signals EM1 and EM2 are asserted (e.g., the emission control signals are both at high voltage levels). When both emission control signals EM1 and EM2 are high, an emission current will flow through drive transistor T2 into the corresponding organic light-emitting diode 304 to produce light 306 (see FIG. 3). The emission current is sometimes referred to as the OLED current or OLED emission current, and the period during which the OLED current is actively producing light at diode 304 is referred to as the emission phase.

At time t1, emission control signal EM1 is deasserted (i.e., driven low) to temporarily suspend the emission phase, which begins a data refresh or data programming phase. At time t2, signal Scan1 may be pulsed high to activate transistors T3 and T6, which initializes the voltage across capacitor Cst to a predetermined voltage difference (e.g., ELVDD minus Vini). The time period where Scan1 is asserted between t2 and t3 may sometimes be referred to as an initialization phase, charge-up phase, initialization time period, charge-up time period, etc.

At time t4, signal Scan1 is low, signal Scan2 is asserted (e.g., driven high), and signal EM2 is deasserted (e.g., driven low), which signifies the end of the initialization phase and the beginning of the on-bias stress phase. In this configuration, only transistors T1 and T2 are turned on (since signal Scan2 is high and Node2 is charged up during the initialization phase). Configured in this way, Node2 remains at VDDEL, and Node3 will be biased to Vdata using transistor T1. In other words, the gate-to-source voltage Vgs of transistor T2 will be set to (VDDEL-Vdata). Vdata is at least partially applied to transistor T2 before any threshold voltage sampling.

At time t5, scan control signal Scan1 is pulsed high while signal Scan2 is asserted and while signals EM1 and EM2 are both deasserted to load a desired data signal from data line 310 into display pixel 22. This time period may be referred to as the data writing phase, threshold voltage sampling and data writing phase, data programming phase, etc. At time t6, scan control signal Scan1 is deasserted (e.g., driven low), which signifies the end of the data programming phase. The emission phase then commences at t7 when emission control signals EM1 and EM2 are reasserted.

It should be noted that, if desired, the on-bias stress period depicted in FIG. 8 may be omitted. Performing the on-bias stress to bias the Vgs of transistor T2 with Vdata can help mitigate hysteresis and prevent first frame dimming. However, satisfactory display performance may sometimes be achieved without the on-bias stress phase.

During low refresh rate operations, the data value of each pixel may only be updated every 1 second. If, in the low refresh rate mode the emission current is only being toggled during the data refresh periods, luminance artifacts may arise. The luminance of the pixels may experience dips during the refresh frames due to sequentially shutting off and then turning on transistor T4, such as during the four phases shown in FIG. 8. Having luminance dips at 1 Hz may result in noticeable flicker to the user. In an effort to eliminate flicker, additional luminance dips may be inserted during the vertical blanking period between refresh frames. The additional luminance dips added during the vertical blanking period between refresh frames may be referred to as anode reset frames. By intentionally generating luminance dips at a higher frequency, the flickering is less noticeable to the human eye.

To ensure satisfactory operation of the display in the low refresh rate mode, anode reset frames may be performed at any desired frequency during the time (e.g., vertical blanking period) between refresh frames. In general, at least 10 anode reset frames, at least 100 anode reset frames, less than 100 anode reset frames, or more than 100 anode reset frames may be performed during the vertical blanking period. The anode reset frames reset the light-emitting diode anode without actually changing the pixel data of each pixel. The anode reset frames allow for reduction of luminance artifacts that may occur if the light-emitting diode remained on/unchanged for full 1 second intervals.

FIG. 9 is a timing diagram that illustrates the operation of organic light-emitting diode display pixel 22 during an anode reset frame. Prior to time t1, signals Scan1 and Scan2 are deasserted (e.g., the scan control signals are both at low voltage levels), whereas signals EM1 and EM2 are asserted (e.g., the emission control signals are both at high voltage levels). When both emission control signals EM1 and EM2 are high, an emission current will flow through drive transistor T2 into the corresponding organic light-emitting diode 304 to produce light 306 (see FIG. 3). The emission current is sometimes referred to as the OLED current or OLED emission current, and the period during which the OLED current is actively producing light at diode 304 is referred to as the emission phase.

At time t1, emission control signal EM1 is deasserted (i.e., driven low) to temporarily suspend the emission phase. Since on-bias stress is applied during the data refresh frame, on-bias stress may also be applied during the anode reset frame to help maintain balance in terms of biasing the pixel transistors. At time t2, signal EM2 is deasserted and signal Scan2 is asserted. This marks the beginning of the on-bias stress phase. Only transistors T1 and T2 are turned on for the on-bias stress phase. Configured in this way, Node3 will be biased to Vdata using transistor T1.

At time t3, signal EM1 is asserted (e.g., EM1 is driven high) to turn on transistor T5, which marks the end of the on-bias stress phase and the beginning of the anode reset phase. At this time, transistors T1 and T5 are both on, so diode anode terminal Node 4 is reset to Vdata (e.g., the voltage of the data line). At time t4, signal Scan2 can be deasserted to mark the end of the anode reset phase. At t5, emission signals EM1 and EM2 are both high to allow the emission current to flow.

In general, an on-bias stress phase may accompany and immediately precede any number of anode reset operations during the vertical blanking period to help replicate and mirror the on-bias stress throughout the operation of display 14. However, the on-bias stress phase may also optionally be omitted before the anode reset operations if desired.

In the example of FIGS. 4 and 5, drivers 48, 50, 52, and 54 each are formed by shift registers that have one register circuit per row in the active area of the display. It may be desirable to minimize the size of the inactive border area around the active area of the display. The register circuits of drivers 48, 50, 52, and 54 may occupy a larger than desired amount of space.

Figure 10:
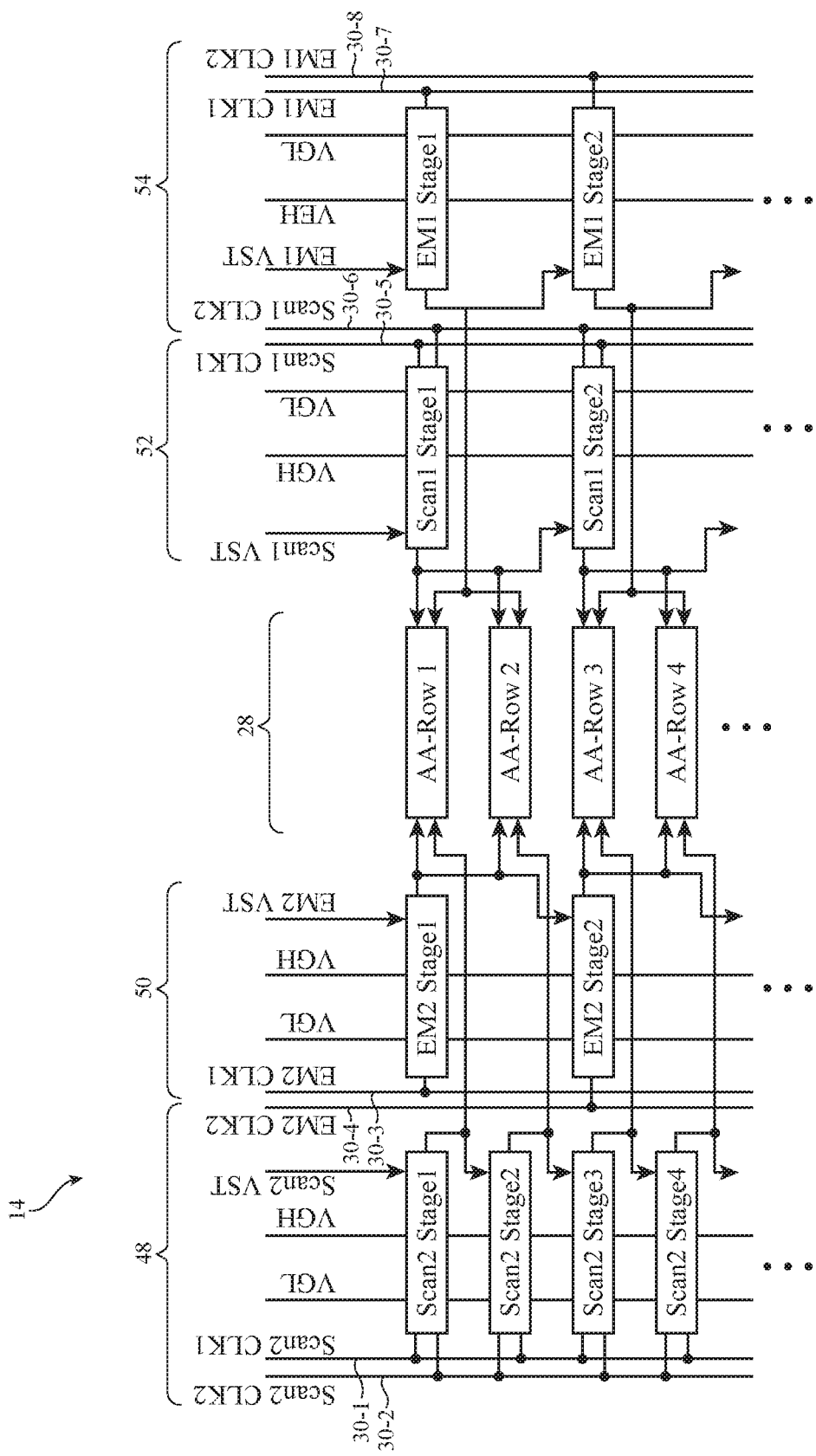
FIG. 10 is a schematic diagram of an illustrative display having gate driver circuitry with at least one driver that has each register circuit shared between multiple rows of pixels in accordance with an embodiment.

To reduce the amount of space in the inactive area taken up by the register circuits of the gate driver circuitry of the display, register circuits in the shift registers may be used to drive two or more rows of pixels (instead of just one row of pixels). FIG. 10 is a schematic diagram showing how one or more register circuits may be shared by two rows of pixels.

As shown in FIG. 10, scan driver 48 is used to provide Scan2 signals to each row of pixels in the active rea, emission driver 50 is used to provide EM2 signals to each row of pixels in the active rea, scan driver 52 is used to provide Scan1 signals to each row of pixels in the active rea, and emission driver 54 is used to provide EM1 signals to each row of pixels in the active rea. Similar to as shown in FIG. 5, scan driver 48 has a register circuit for each row of pixels in active area 28. The stage 1 register circuit of scan driver 48 is used to provide Scan2 signals to row 1 of the active area, the stage 2 register circuit of scan driver 48 is used to provide Scan2 signals to row 2 of the active area, etc. Each stage of scan driver 48 provides an output signal (Scan2) to one row of pixels in the active area as well as the next stage of the scan driver.

In contrast, emission driver 50 includes a register circuit for every two rows of active area 28. As shown, stage 1 of emission driver 50 is used to provide EM2 signals to both rows 1 and 2 of active area 28. Stage 2 of emission driver 50 is used to provide EM2 signals to both rows 3 and 4 of active area 28. Each stage of emission driver 50 provides an output signal (EM2) to two rows of pixels in the active area as well as the next stage of the emission driver. This concept may be applied to other drivers, such as scan driver 52 and emission driver 54.

Scan driver 52 includes a register circuit for every two rows of active area 28. As shown, stage 1 of scan driver 52 is used to provide Scan1 signals to both rows 1 and 2 of active area 28. Stage 2 of scan driver 52 is used to provide Scan1 signals to both rows 3 and 4 of active area 28. Each stage of scan driver 52 provides an output signal (Scan1) to two rows of pixels in the active area as well as the next stage of the scan driver.

Emission driver 54 includes a register circuit for every two rows of active area 28. As shown, stage 1 of emission driver 54 is used to provide EM1 signals to both rows 1 and 2 of active area 28. Stage 2 of emission driver 54 is used to provide EM1 signals to both rows 3 and 4 of active area 28. Each stage of emission driver 54 provides an output signal (EM1) to two rows of pixels in the active area as well as the next stage of the emission driver.

The arrangement of FIG. 10 reduces the number of register circuits that have to be fit in the inactive area of the display. Consider a scenario in which the active area of the display has n rows. If each of the drivers has a one register circuit per row (as in FIGS. 4 and 5), then the total number of register circuits will equal 4n. In FIG. 10, the total number of register circuits is 2.5n, meaning the arrangement of FIG. 10 results in a 37.5% reduction in the number of register circuits required compared to the arrangement of FIGS. 4 and 5.

As shown in FIG. 10, each of the drivers has corresponding power supply lines to supply voltages VGL and VGH. Each register circuit in each of the drivers receives supply voltages VGL and VGH. Stage 1 of each of the drivers receives a corresponding start pulse for that driver. Stage 1 of scan driver 48 receives a Scan2 start pulse (Scan2 VST), stage 1 of emission driver 50 receives an EM2 start pulse (EM2 VST), stage 1 of scan driver 52 receives a Scan1 start pulse (Scan1 VST), and stage 1 of emission driver 54 receives an EM1 start pulse (EM1 VST).

Each driver may have corresponding clock signals provided by clock signal paths. Clock signal paths 30-1 and 30-2 provide first and second clock signals (CLK1 and CLK2) for Scan2 driver 48. Clock signal paths 30-3 and 30-4 provide first and second clock signals (CLK1 and CLK2) for EM2 driver 50. Clock signal paths 30-5 and 30-6 provide first and second clock signals (CLK1 and CLK2) for Scan1 driver 52. Clock signal paths 30-7 and 30-8 provide first and second clock signals (CLK1 and CLK2) for EM1 driver 54. Having different clock signals for the different drivers may allow for the drivers with different numbers of register circuits to still operate in a synchronous fashion. For example, if the same clock signal was used for scan drivers 48 and 52, the Scan1 pulse would propagate through the rows of the active area twice as fast as the Scan2 pulse. The Scan1 driver may therefore use a clock signal that is half the frequency of the clock signal for the Scan2 driver for synchronous operation.

In FIG. 10, scan driver 52 and emission drivers 50 and 54 may receive clock signals of the same frequency (e.g., a first frequency). Scan driver 48 may receive clock signals of a second frequency that is twice the frequency of the frequency (e.g., there will be two clock signals for scan driver 48 for every one clock signal for drivers 50, 52, and 54). If drivers 50, 52, and 54 have register circuits that provide signals to three rows in the active area, then the second frequency (for driver 48) may be three times the first frequency (for drivers 50, 52, and 54). In general, scan driver 48 may use clock signals at a baseline frequency. The other drivers may use clock signals at a frequency that is equal to the baseline frequency divided by the number of rows shared by each register circuit in that driver. In some examples, drivers may have register circuits that share different numbers of rows per register circuit. For example, each register circuit in scan driver 52 may provide signals to two rows of pixels whereas each register circuit in emission drivers 50 and 54 may provide signals to three rows of pixels. In this example, scan driver 48 may use clock signals at the baseline frequency, scan driver 52 may use clock signals at a second frequency that is half of the baseline frequency, and emission drivers 50 and 54 may use clock signals at a third frequency that is a third of the baseline frequency. Reducing the clock frequency of the drivers (e.g., drivers 50, 52, and 54) may reduce power consumption of the gate driver circuitry.

Clock signal paths that provide the same clock signals may be shorted together if desired. For example, in FIG. 10, clock signal paths 30-3, 30-5, and 30-7 may provide the same CLK1 signal to drivers 50, 52, and 54. Clock signal paths 30-3, 30-5, and 30-7 may therefore optionally be shorted together. Similarly, clock signal paths 30-4, 30-6, and 30-8 may provide the same CLK2 signal to drivers 50, 52, and 54. Clock signal paths 30-4, 30-6, and 30-8 may therefore optionally be shorted together.

In FIG. 10, the scan direction of drivers 48, 50, 52, and 54 is parallel to columns of pixels in the active area. In other words, the rows of pixels in the active area may extend along a first dimension and the columns of pixels in the active area may extend along a second dimension that is orthogonal to the first dimension. The scan direction of drivers 48, 50, 52, and 54 may be parallel to the second dimension and orthogonal to the first dimension.

Figure 11:
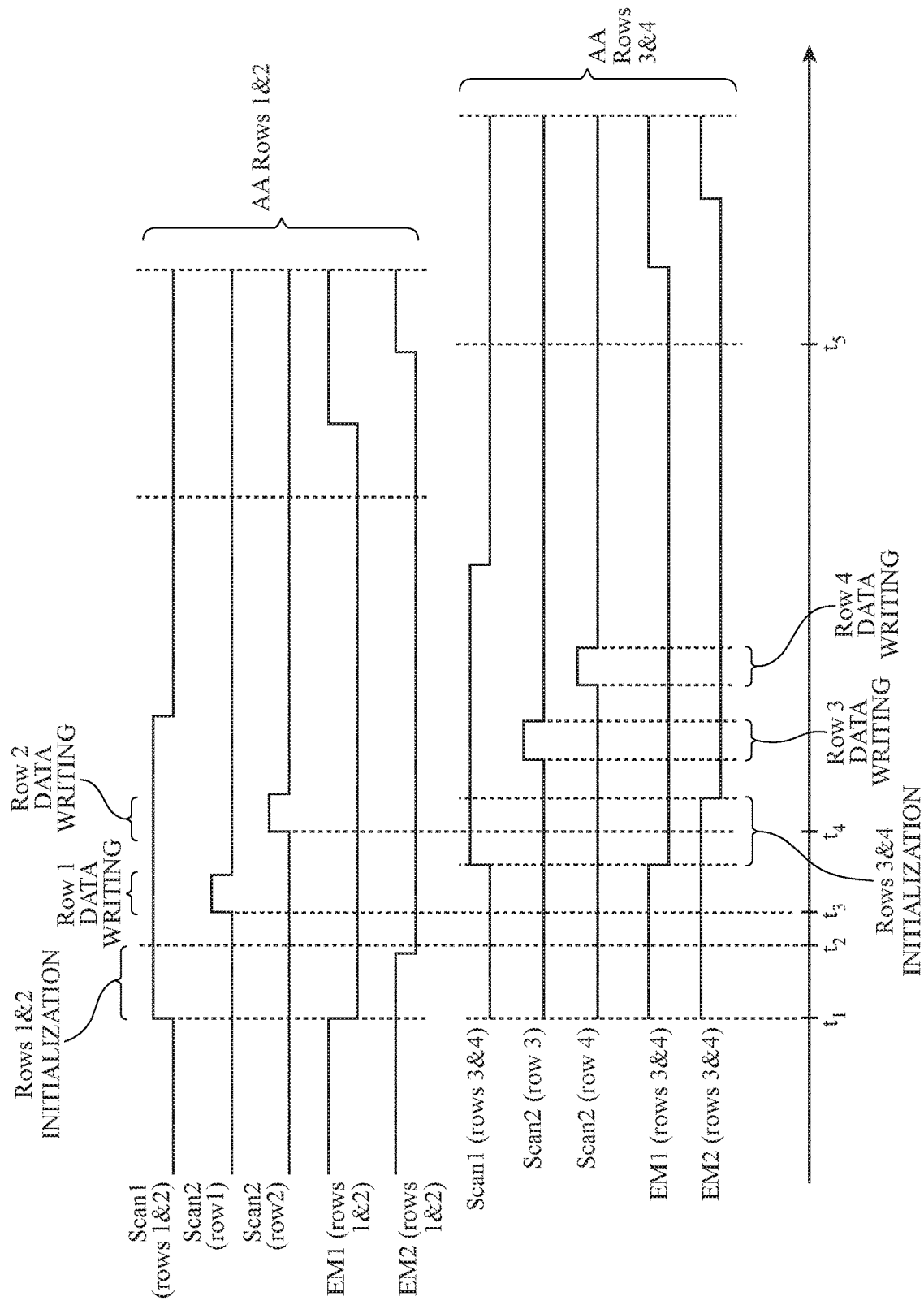
FIG. 11 is a timing diagram showing illustrative signals provided by the gate driver circuitry of FIG. 10 for a refresh frame in accordance with an embodiment.
Figure 12:
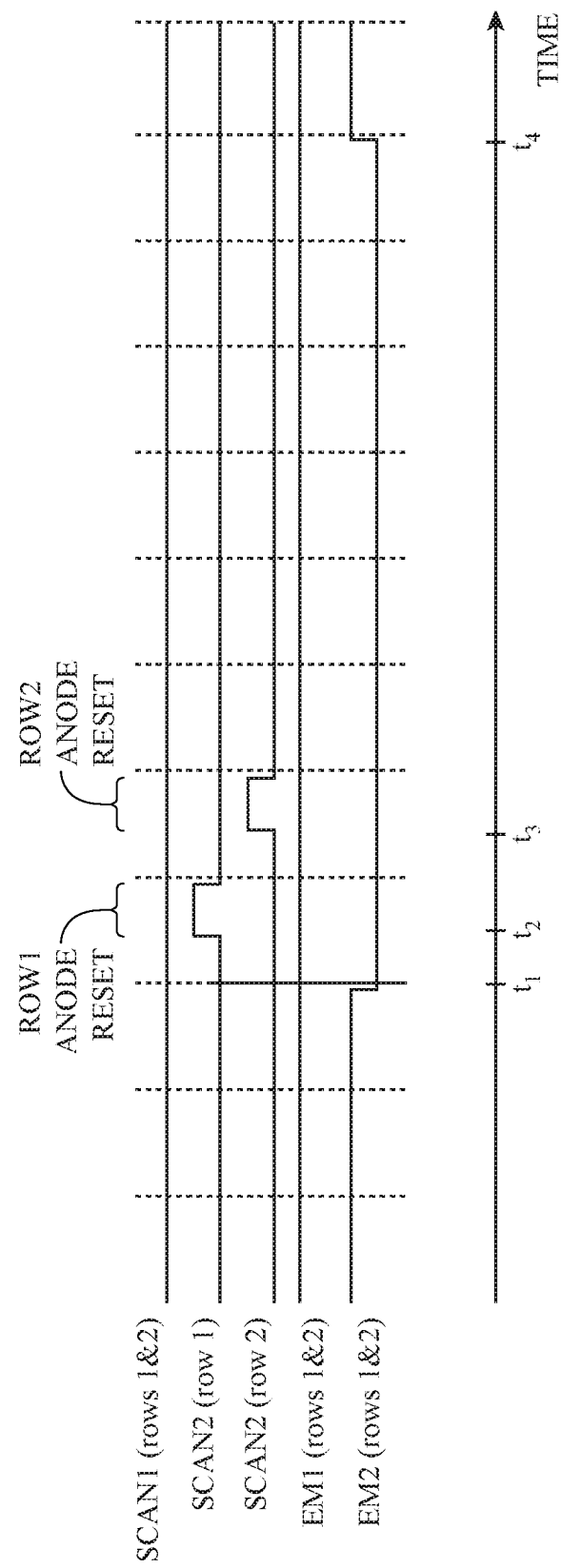
FIG. 12 is a timing diagram showing illustrative signals provided by the gate driver circuitry of FIG. 10 for an anode reset frame in accordance with an embodiment.

Signal waveforms that may be applied to display pixel 22 by the gate driver circuitry of FIG. 10 are shown in FIGS. 11 and 12. FIG. 11 shows a timing diagram for a refresh frame. In the example of FIG. 11, the on-bias stress phase is omitted from the pixel operation. The timing diagrams for both the first and second rows and third and fourth rows of the active area are shown in FIG. 11. As shown in FIG. 11, the Scan1, EM1, and EM2 signals are provided to rows 1 and 2 of the active area. In contrast, rows 1 and 2 receive unique Scan2 signals.

Prior to time t1, signals Scan1 and Scan2 (for both rows) are deasserted (e.g., the scan control signals are both at low voltage levels), whereas signals EM1 and EM2 are asserted (e.g., the emission control signals are both at high voltage levels). When both emission control signals EM1 and EM2 are high, an emission current will flow through drive transistor T2 into the corresponding organic light-emitting diode 304 to produce light 306.

At time t1, emission control signal EM1 is deasserted (i.e., driven low) to temporarily suspend the emission phase, which begins a data refresh or data programming phase. Scan1 may be pulsed high, which initializes the voltage across capacitor Cst to a predetermined voltage difference (e.g., ELVDD minus Vini). The time period where Scan1 is asserted between t1 and t2 may sometimes be referred to as an initialization phase, charge-up phase, initialization time period, charge-up time period, etc. Because the Scan1 signal is identical for rows 1 and 2, the initialization phase for rows 1 and 2 may be concurrent.

At time t3, scan control signal Scan2 for row 1 is pulsed high while signal Scan1 is asserted and while signals EM1 and EM2 are both deasserted to load a desired data signal from data line 310 into display pixels 22 in row 1. This time period may be referred to as the row 1 data writing phase, threshold voltage sampling and data writing phase, data programming phase, etc. At time t4, scan control signal Scan2 for row 2 is pulsed high while signal Scan1 is asserted and while signals EM1 and EM2 are both deasserted to load a desired data signal from data line 310 into display pixels 22 in row 2. This time period may be referred to as the row 2 data writing phase, threshold voltage sampling and data writing phase, data programming phase, etc. The emission phase then commences at t5 when emission control signals EM1 and EM2 are reasserted.

The same signal sequence will be repeated for rows 3 and 4, but with a delay for the signals to propagate through the shift register. Therefore, as shown in FIG. 11, the pixels may still operate effectively during the refresh frame even when the Scan1, EM1, and EM2 drivers have register circuits shared between two rows of pixels.

FIG. 12 shows a timing diagram for an anode reset frame that is driven by the gate driver circuitry of FIG. 10. Prior to time t1, signals Scan1 and Scan2 (for both rows) are deasserted (e.g., the scan control signals are both at low voltage levels), whereas signals EM1 and EM2 are asserted (e.g., the emission control signals are both at high voltage levels). Emission control signal EM1 remains at the high voltage level throughout the anode reset frame and Scan1 remains at the low voltage level throughout the anode reset frame. When both emission control signals EM1 and EM2 are high, an emission current will flow through drive transistor T2 into the corresponding organic light-emitting diode 304 to produce light 306 (see FIG. 3).

At time t1, emission control signal EM2 is deasserted (i.e., driven low) to temporarily suspend the emission phase. Since on-bias stress is omitted during the data refresh frame (as shown in FIG. 10), on-bias stress may also be omitted during the anode reset frame to help maintain balance in terms of biasing the pixel transistors.

At time t2, signal Scan2 for row 1 is asserted (e.g., Scan2 is driven high) to turn on transistor T1. At this time, transistors T1 and T5 are both on, so diode anode terminal Node 4 is reset to Vdata (e.g., the voltage of the data line). Asserting signal Scan2 at t2 begins the row 1 anode reset phase. Signal Scan2 for row 1 is then deasserted to end the row 1 anode reset phase. At time t3, signal Scan2 for row 2 is asserted (e.g., Scan2 is driven high) for the row 2 anode reset phase. At t4, emission signals EM1 and EM2 are both high to allow the emission current to flow.

In the example of FIGS. 10-12, an example is described where each stage of a shift register is shared between two rows of pixels in the active area of the display. However, this example is merely illustrative. For additional reduction of the space occupied by the gate driver circuitry, each stage of a shift register may be shared by more than two rows of pixels. Each register circuit may provide signals to three rows of pixels, four rows of pixels, more than four rows of pixels, more than eight rows of pixels, more than ten rows of pixels, between two and four rows of pixels, less than ten rows of pixels, between two and ten rows of pixels, etc.

In the example of FIG. 10, the number of register circuits is asymmetric on the left and right sides of the active area of the display. If desired, register circuits for a single driver may be positioned on both sides of the active area. This may allow for a symmetrical design where the number of register circuits on each side of the active area is equal.

Figure 13:
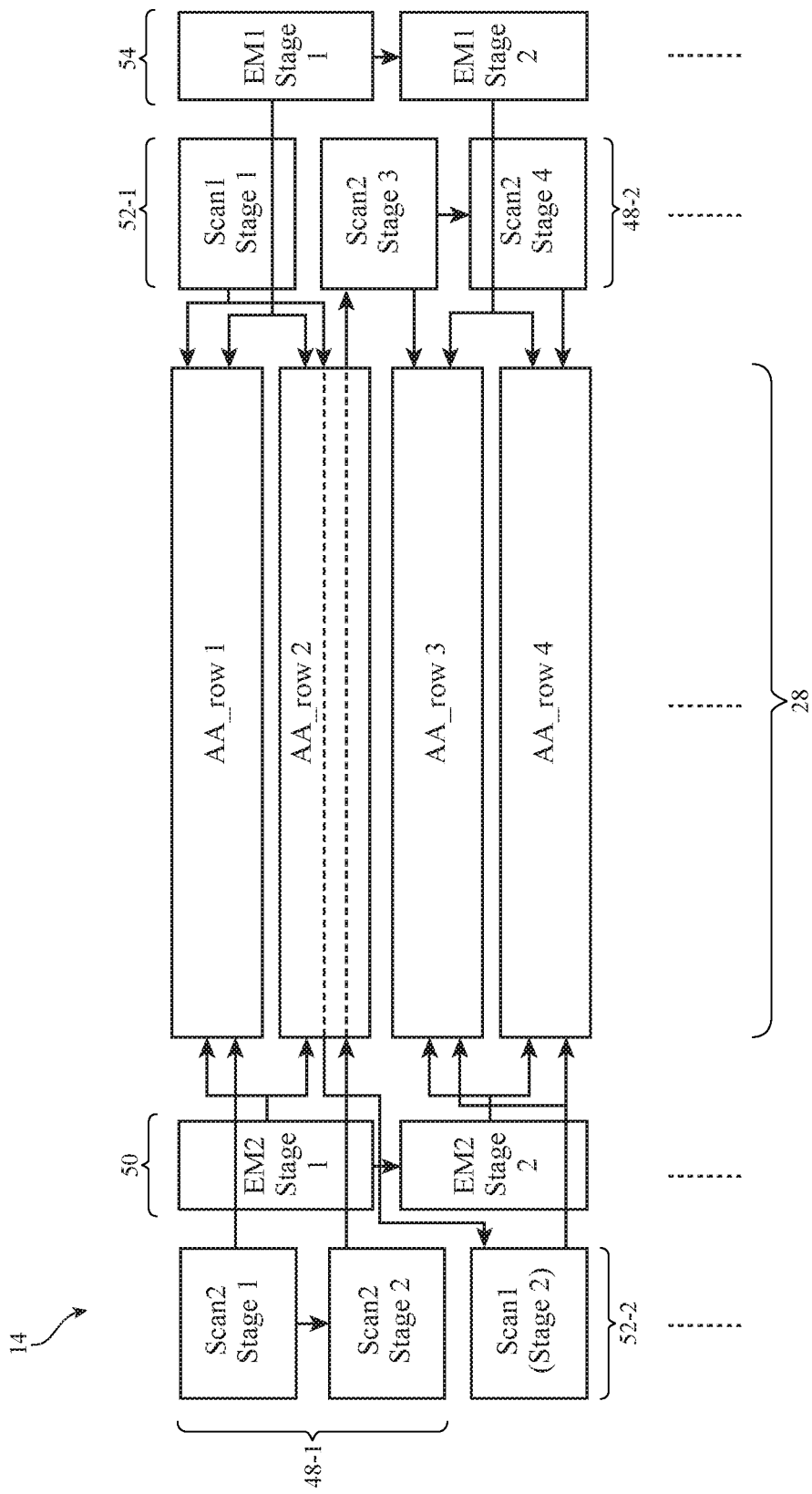
FIG. 13 is a schematic diagram of an illustrative display having gate driver circuitry with at least one shift register that includes register circuits on first and second opposing sides of the active area in accordance with an embodiment.

FIG. 13 is a schematic diagram showing an example where register circuits are shared between multiple rows and register circuits for a given driver are positioned on first and second opposing sides of the active area. As shown in FIG. 13, emission drivers 50 and 54 may have a similar arrangement to as in FIG. 10. Each register circuit of the emission drivers may be shared by two rows of pixels. Similar to FIG. 10, shift register 50 is formed entirely on a left side of the active area and shift register 54 is formed entirely on a right side of the active area. In contrast, scan drivers 48 and 52 are split between the left side of the active area and the right side of the active area.

As shown in FIG. 13, scan driver 48 includes a first portion 48-1 formed on the left side of the active area. Stage 1 of the Scan2 driver may provide an output signal (Scan2) to row 1 of the active area and to stage 2 of the Scan2 driver. Stage 2 of the Scan2 driver may similarly provide an output signal to row 2 of the active area and to stage 3 of the Scan2 driver. However, in FIG. 13, stage 3 of the Scan2 driver is positioned on the other side of the active area. Portion 48-2 of the Scan2 driver is formed on the right side of the active area. Despite the register circuits being split across the active area, the control signals still propagate through the stages of the shift register as if the shift register was all on one side of the active area.

Scan driver 52 includes a first portion 52-1 formed on the right side of the active area and a second portion 52-2 formed on the left side of the active area. Stage 1 of the Scan1 driver may provide an output signal (Scan1) to rows 1 and 2 of the active area and to stage 2 of the Scan1 driver. Stage 2 of the Scan1 driver may provide signals to rows 3 and 4 of the active area. However, in FIG. 13, stage 2 of the Scan1 driver is positioned on the opposite side of the active area as stage 1.

In FIG. 13, similar to as in FIG. 10, the scan direction of drivers 48, 50, 52, and 54 is parallel to columns of pixels in the active area. The active area of the display may have first and second opposing sides (e.g., upper and lower edges) connected by third and fourth opposing sides (e.g., left and right edges). The scan direction of drivers 48, 50, 52, and 54 may be from the first side of the active area to the second side of the active area (e.g., the drivers scan from the upper edge of the active area to the lower edge of the active area). Drivers 48 and 52 are split across the active area such that some register circuits are formed on both the third and fourth sides of the active area.

Similar to as shown in FIG. 10, the display of FIG. 13 also may include supply lines to provide supply voltages VGL and VGH, clock paths to provide clock signals to each driver, and control lines to provide start pulses to each driver.

The pattern of the register circuits for the scan drivers switching between the left side of the display and the right side of the display (as shown in FIG. 13) may continue for the duration of the shift register. The shift register may 'jump' across the active area at regular or irregular intervals depending on the design requirements of the specific display. Splitting the shift register across the display at one or more locations allows for more flexibility in how the register circuits are distributed in the inactive area of the display.

Additional register circuits may be eliminated from the display by combining the EM1 driver and the EM2 driver into one shift register. In some cases, the waveforms of the EM1 and EM2 signals are the same, just shifted in time relative to one another. Therefore, a single register circuit may be used to provide both the EM1 and EM2 signals.

Figure 14:
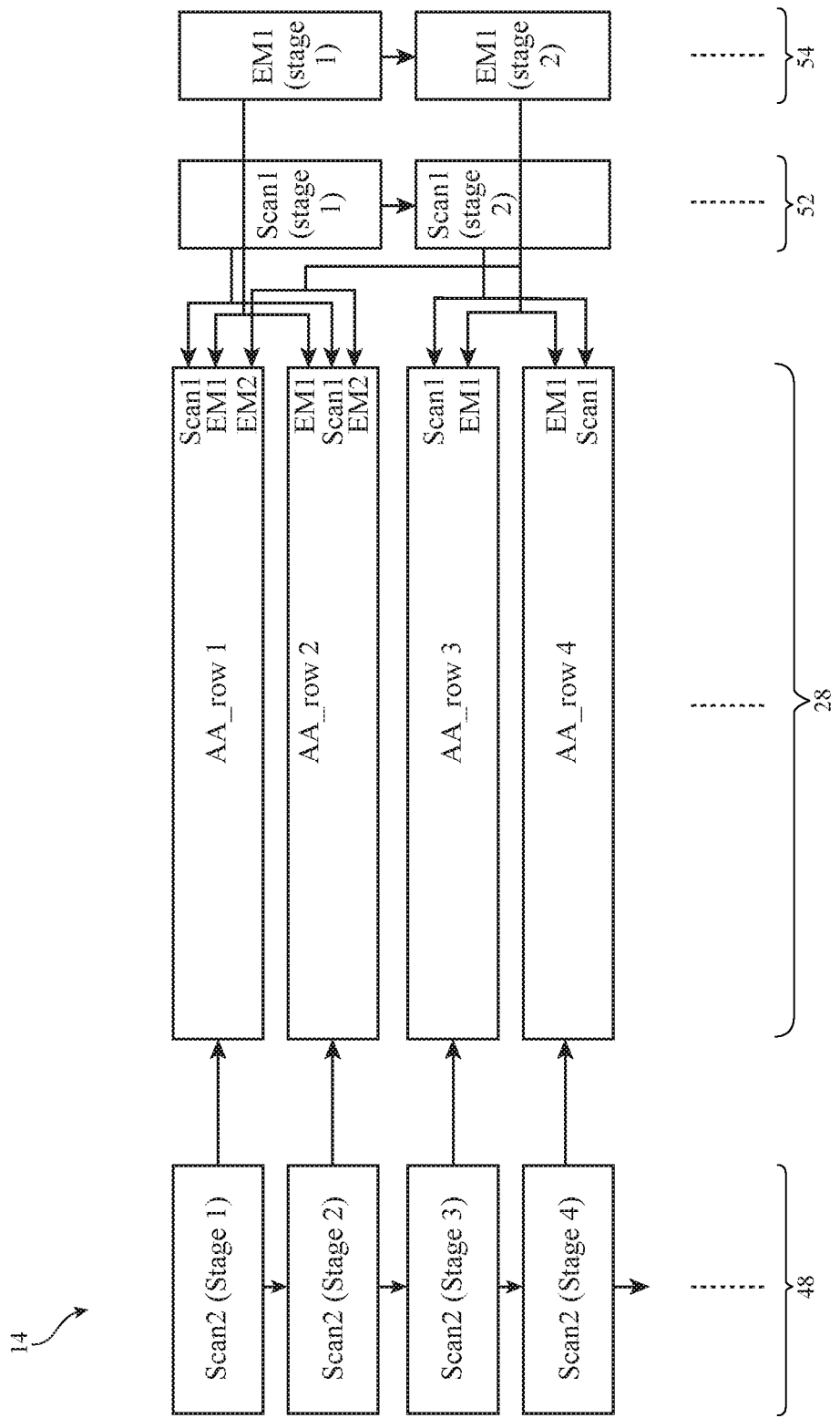
FIG. 14 is a schematic diagram of an illustrative display having gate driver circuitry that includes a single emission driver that provides first and second emission signals to the display pixels in accordance with an embodiment.

As shown in FIG. 14, the emission driver may have a first stage that provides an output signal to both rows 1 and 2. The output signal serves as EM1 for rows 1 and 2 (e.g., the output signal is provided to terminal 314 of FIG. 3). The output signal is also provided to the second stage of the EM1 shift register. Stage 2 then provides the output signal to rows 3 and 4 to serve as EM1 for rows 3 and 4. However, stage 2 also provides the output signal back to rows 1 and 2 to serve as EM2 for rows 1 and 2. In other words, the output of stage 2 is coupled both to terminal 314 of the pixels in rows 3 and 4 to serve as EM1 for rows 3 and 4 and to terminal 315 of the pixels in rows 1 and 2 to serve as EM2 for the two previous rows (rows 1 and 2). Because EM1 and EM2 have the same waveform during operation of the pixels, the operation of the pixel will not be affected by using just one emission driver for both the EM1 and EM2 signals.

Similar to as shown in FIG. 10, the display of FIG. 14 also may include supply lines to provide supply voltages VGL and VGH, clock paths to provide clock signals to each driver, and control lines to provide start pulses to each driver.

Figure 15:
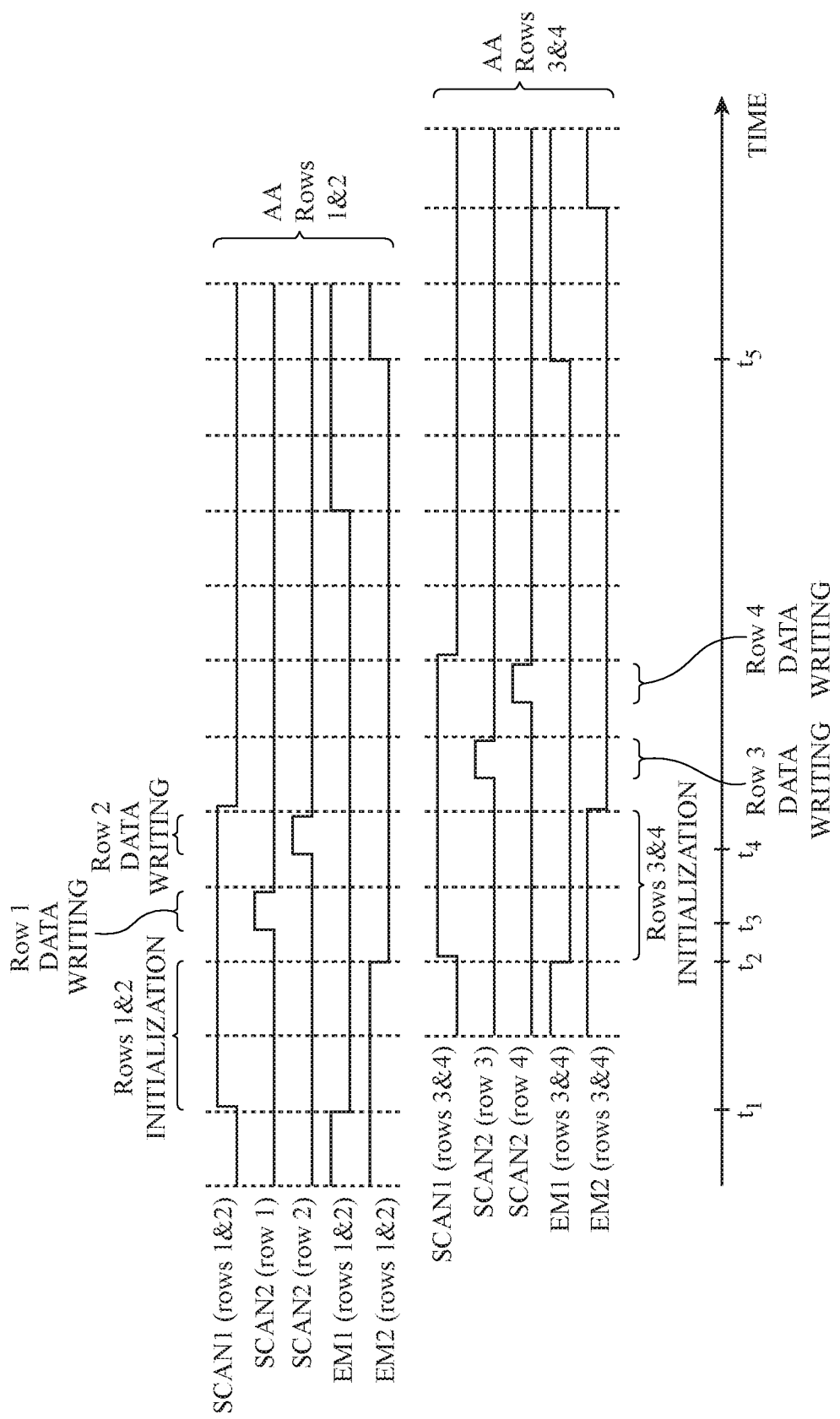
FIG. 15 is a timing diagram showing illustrative signals provided by the gate driver circuitry of FIG. 14 for a refresh frame in accordance with an embodiment.
Figure 16:
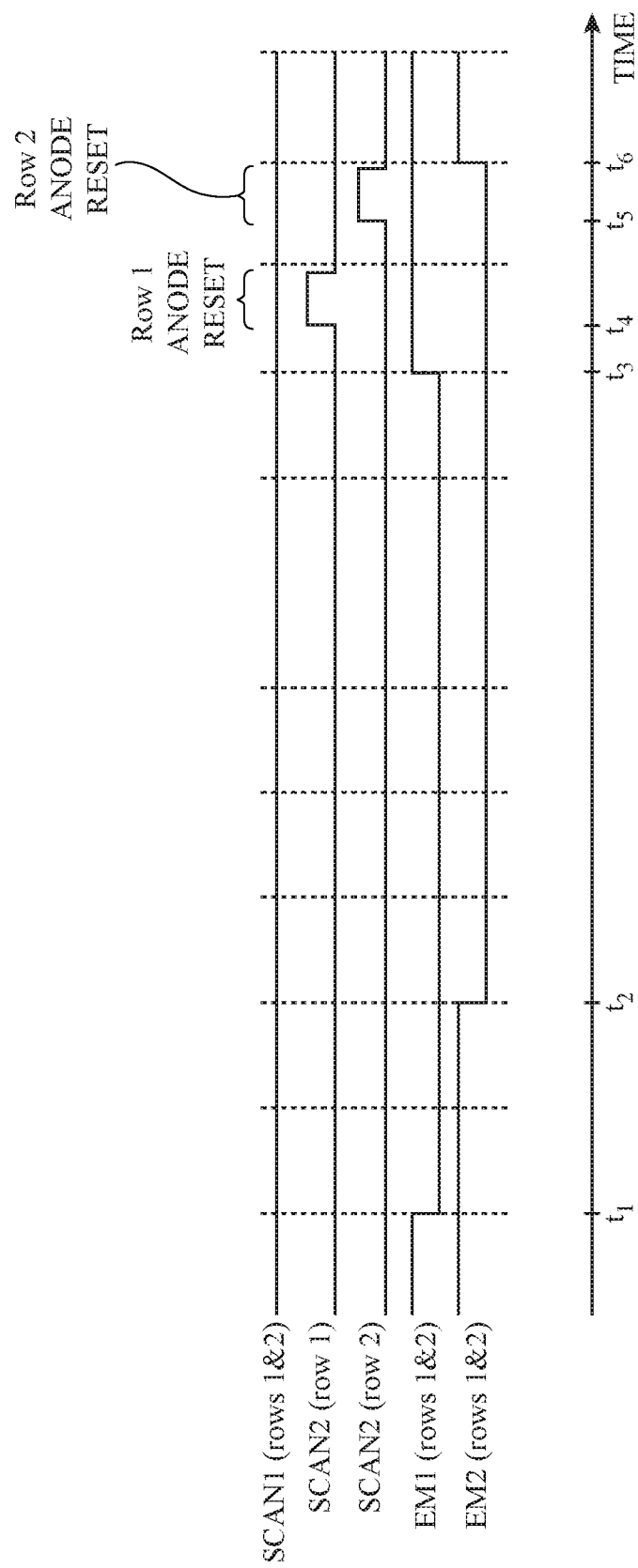
FIG. 16 is a timing diagram showing illustrative signals provided by the gate driver circuitry of FIG. 14 for an anode reset frame in accordance with an embodiment.

Signal waveforms that may be applied to display pixel 22 by the gate driver circuitry of FIG. 14 are shown in FIGS. 15 and 16. FIG. 15 shows a timing diagram for a refresh frame. In the example of FIG. 15, the on-bias stress phase is omitted from the pixel operation. The timing diagrams for both the first and second rows and third and fourth rows of the active area are shown in FIG. 15. As shown in FIG. 15, the Scan1, EM1, and EM2 signals are provided to rows 1 and 2 of the active area. In contrast, rows 1 and 2 receive unique Scan2 signals.

Prior to time t1, signals Scan1 and Scan2 (for both rows) are deasserted (e.g., the scan control signals are both at low voltage levels), whereas signals EM1 and EM2 are asserted (e.g., the emission control signals are both at high voltage levels). When both emission control signals EM1 and EM2 are high, an emission current will flow through drive transistor T2 into the corresponding organic light-emitting diode 304 to produce light 306.

At time t1, emission control signal EM1 is deasserted (i.e., driven low) to temporarily suspend the emission phase, which begins a data refresh or data programming phase. Scan1 may be pulsed high, which initializes the voltage across capacitor Cst to a predetermined voltage difference in both rows 1 and 2. The time period where Scan1 is asserted between t1 and t2 may sometimes be referred to as an initialization phase, charge-up phase, initialization time period, charge-up time period, etc.

At time t3, scan control signal Scan2 for row 1 is pulsed high while signal Scan1 is asserted and while signals EM1 and EM2 are both deasserted to load a desired data signal from data line 310 into display pixels 22 in row 1. This time period may be referred to as the row 1 data writing phase, threshold voltage sampling and data writing phase, data programming phase, etc. At time t4, scan control signal Scan2 for row 2 is pulsed high while signal Scan1 is asserted and while signals EM1 and EM2 are both deasserted to load a desired data signal from data line 310 into display pixels 22 in row 2. This time period may be referred to as the row 2 data writing phase, threshold voltage sampling and data writing phase, data programming phase, etc. The emission phase then commences at t5 when emission control signals EM1 and EM2 are reasserted.

The same signal sequence will be repeated for rows 3 and 4, but with a delay for the signals to propagate through the shift register. As shown, the delay in the signal sequence between rows 1 and 2 and rows 3 and 4 is such that the waveform of EM2 for rows 1 and 2 is the same as the waveform of EM1 for rows 3 and 4. As shown, when EM2 for rows 1 and 2 drops at t2, EM1 for rows 3 and 4 also drops. Then, when EM2 for rows 1 and 2 rises at t5, EM1 for rows 3 and 4 also rises. This enables the same signal to be used both for EM2 for rows 1 and 2 and for EM1 for rows 3 and 4. Therefore, as shown in FIG. 15, the pixels may still operate effectively during the refresh frame even when a single emission driver provides both the EM1 and EM2 signals.

FIG. 16 shows a timing diagram for an anode reset frame that is driven by the gate driver circuitry of FIG. 14. Prior to time t1, signals Scan1 and Scan2 (for both rows) are deasserted (e.g., the scan control signals are both at low voltage levels), whereas signals EM1 and EM2 are asserted (e.g., the emission control signals are both at high voltage levels). Scan1 remains at the low voltage level throughout the anode reset frame. When both emission control signals EM1 and EM2 are high, an emission current will flow through drive transistor T2 into the corresponding organic light-emitting diode 304 to produce light 306 (see FIG. 3).

At time t1, emission control signal EM1 is deasserted (i.e., driven low) to temporarily suspend the emission phase. Since on-bias stress is omitted during the data refresh frame of FIG. 15, on-bias stress may also be omitted during the anode reset frame of FIG. 16 to help maintain balance in terms of biasing the pixel transistors.

At time t2, emission control signal EM2 is deasserted. Signal EM1 is subsequently asserted at t3. At time t4, signal Scan2 for row 1 is asserted (e.g., Scan2 is driven high) to turn on transistor T1. At this time, transistors T1 and T5 are both on, so diode anode terminal Node 4 is reset to Vdata (e.g., the voltage of the data line). Signal Scan2 for row 1 is deasserted to end the row 1 anode reset phase. At time t5, signal Scan2 for row 2 is asserted (e.g., Scan2 is driven high) for the row 2 anode reset phase. At t6, emission signals EM1 and EM2 are both high to allow the emission current to flow.

In FIG. 16, similar to as in FIG. 15, the same signal sequence will be repeated for rows 3 and 4, but with a delay for the signals to propagate through the shift register. The delay in the signal sequence between rows 1 and 2 and rows 3 and 4 is such that the waveform of EM2 for rows 1 and 2 is the same as the waveform of EM1 for rows 3 and 4. This enables the same signal to be used both for EM2 for rows 1 and 2 and for EM1 for rows 3 and 4. Therefore, the pixels may operate effectively during both the anode reset frames and the refresh frames even when a single emission driver provides both the EM1 and EM2 signals.

In addition to the reduced required inactive area space, omitting one of the emission drivers reduces the amount of power consumption required by the gate driver circuitry.

If desired, register circuits for a driver in FIG. 14 may be positioned on both sides of the active area, similar to as shown in FIG. 13.

Figure 17:
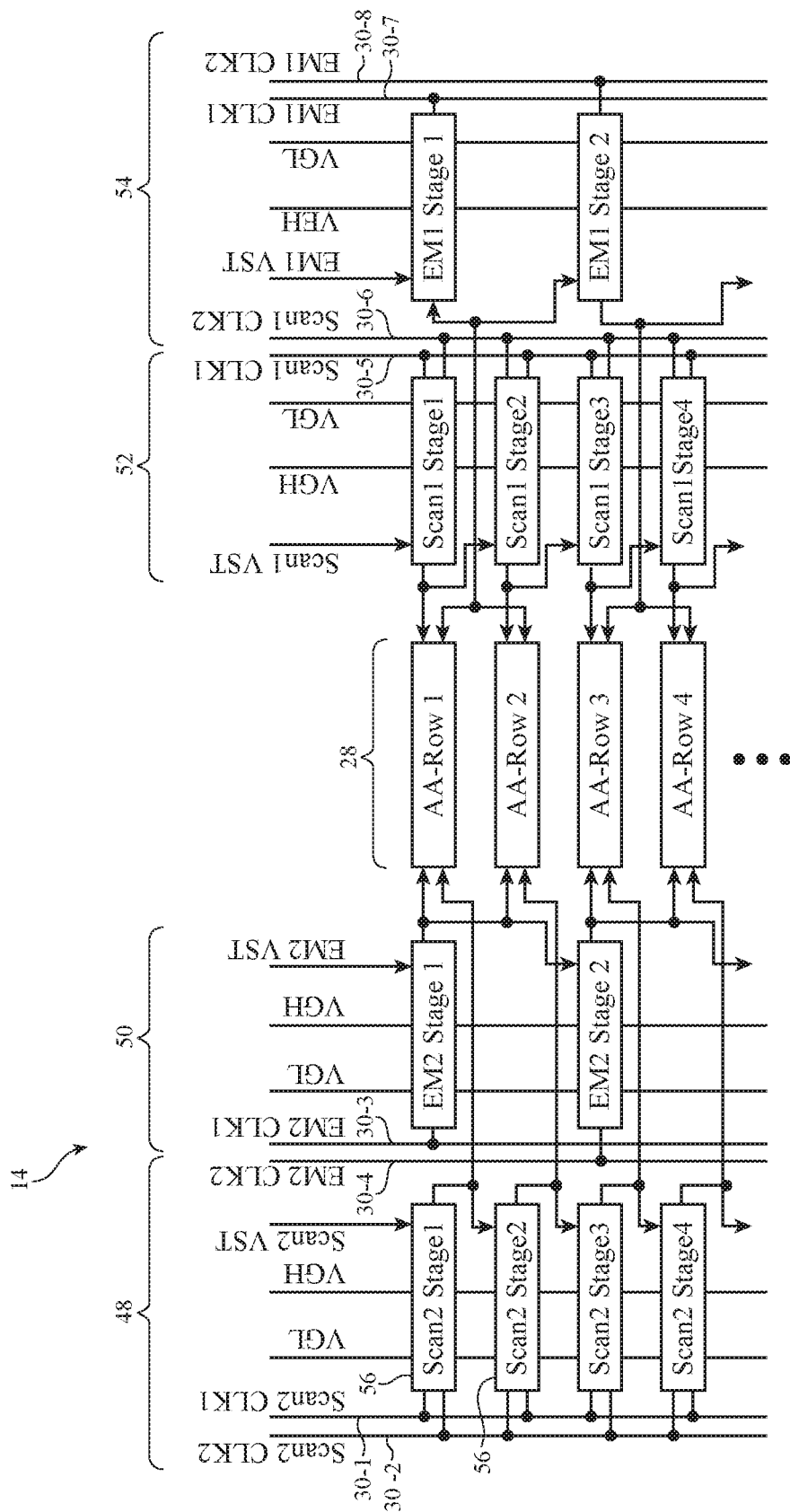
FIG. 17 is a schematic diagram of an illustrative display having first and second scan drivers with register circuits that each provide outputs to a single row and first and second emission drivers that each provide output to first and second rows in accordance with an embodiment.

In the example of FIGS. 10-16, the on-bias stress phase is omitted during the refresh frames and anode reset frames. In some displays, it may be desirable to include the on-bias stress phase while still reducing the number of total register circuits in the display. FIG. 17 is a schematic diagram of an illustrative display that has register circuit sharing for reduced inactive area space consumption while still allowing an on-bias stress phase during the refresh frames and anode reset frames. As shown in FIG. 17, both scan drivers 48 and 52 may include one register circuit per row. Emission drivers 50 and 54 may include one register circuit per two rows in the active area.

Emission driver 50 includes a register circuit for every two rows of active area 28. As shown, stage 1 of emission driver 50 is used to provide EM2 signals to both rows 1 and 2 of active area 28 (as well as stage 2 of the emission driver). Stage 2 of emission driver 50 is used to provide EM2 signals to both rows 3 and 4 of active area 28. Each stage of emission driver 50 provides an output signal (EM2) to two row of pixels in the active area as well as the next stage of the emission driver.

Emission driver 54 includes a register circuit for every two rows of active area 28. As shown, stage 1 of emission driver 54 is used to provide EM1 signals to both rows 1 and 2 of active area 28. Stage 2 of emission driver 54 is used to provide EM1 signals to both rows 3 and 4 of active area 28. Each stage of emission driver 54 provides an output signal (EM1) to two row of pixels in the active area as well as the next stage of the emission driver.

The arrangement of FIG. 17 reduces the number of register circuits that have to be fit in the inactive area of the display. Consider a scenario in which the active area of the display has n rows. If each of the drivers has a one register circuit per row (as in FIGS. 4 and 5), then the total number of register circuits will equal 4n. In FIG. 17, the total number of register circuits is 3n, meaning a 25% reduction in the number of register circuits required. Thus, there is still a significant reduction in required register circuits while still enabling on-bias stress during the refresh frames and anode reset frames.

Similar to as in FIG. 10, each of the drivers in FIG. 17 has corresponding power supply lines to supply voltages VGL and VGH. Each register circuit in each of the drivers receives supply voltages VGL and VGH. Stage 1 of each of the drivers receives a corresponding start pulse for that driver. Stage 1 of scan driver 48 receives a Scan2 start pulse (Scan2 VST), stage 1 of emission driver 50 receives an EM2 start pulse (EM2 VST), stage 1 of scan driver 52 receives a Scan1 start pulse (Scan1 VST), and stage 1 of emission driver 54 receives an EM1 start pulse (EM1 VST).

Each driver may have corresponding clock signals provided by clock signal paths. Clock signal paths 30-1 and 30-2 provide first and second clock signals (CLK1 and CLK2) for Scan2 driver 48. Clock signal paths 30-3 and 30-4 provide first and second clock signals (CLK1 and CLK2) for EM2 driver 50. Clock signal paths 30-5 and 30-6 provide first and second clock signals (CLK1 and CLK2) for Scan1 driver 52. Clock signal paths 30-7 and 30-8 provide first and second clock signals (CLK1 and CLK2) for EM1 driver 54. Having different clock signals for the different drivers may allow for the drivers with different numbers of register circuits to still operate in a synchronous fashion. The EM1 and EM2 drivers may therefore use a clock signal that is half the frequency of the clock signal for the Scan1 and Scan2 drivers for synchronous operation.

In general, for all of the embodiments described herein, appropriate adjustments may be made to the clock signals (as discussed above) in order to allow for synchronous operation of shift registers that include different numbers of register circuits.

Figure 18:
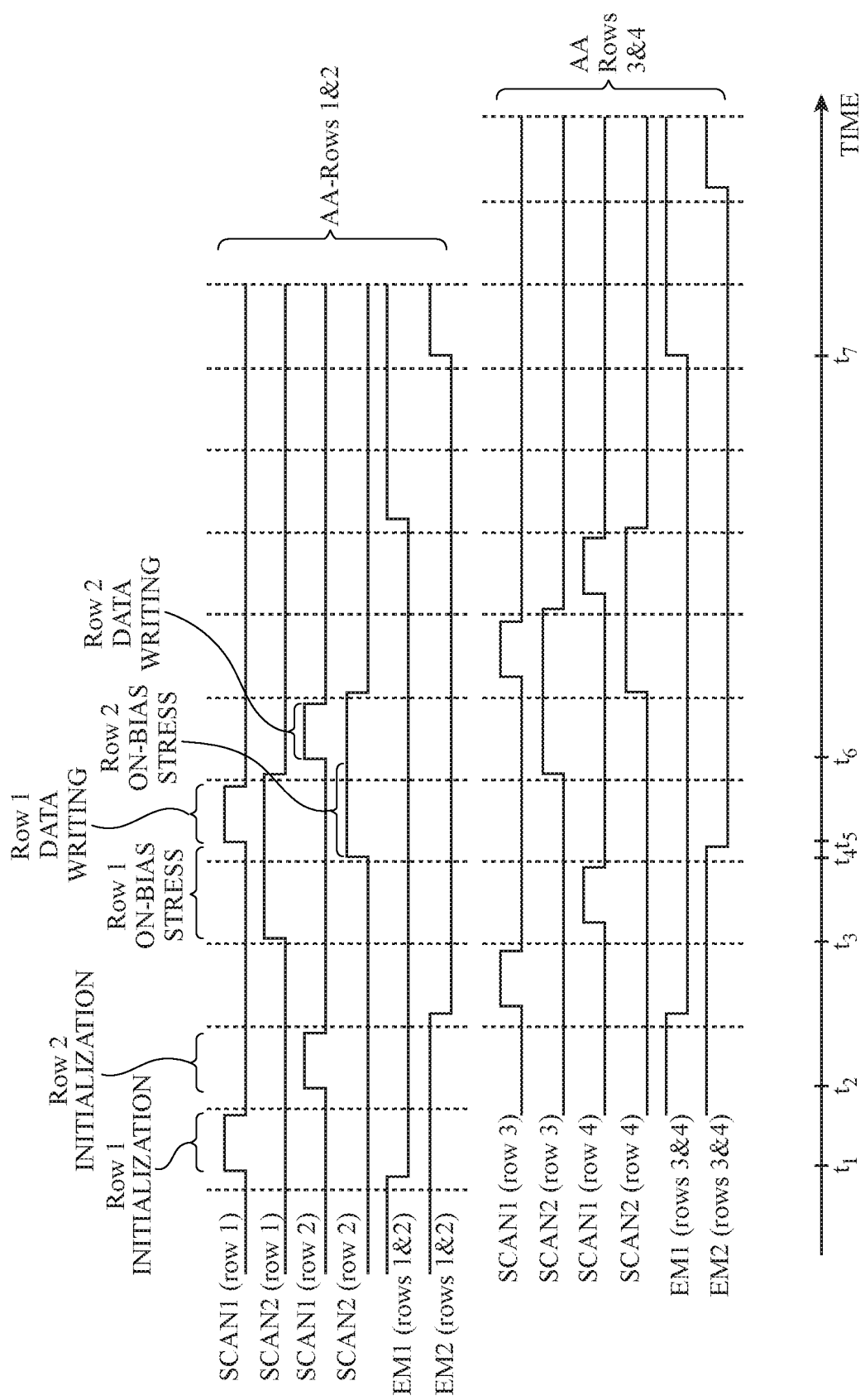
FIG. 18 is a timing diagram showing illustrative signals provided by the gate driver circuitry of FIG. 17 for a refresh frame in accordance with an embodiment.
Figure 19:
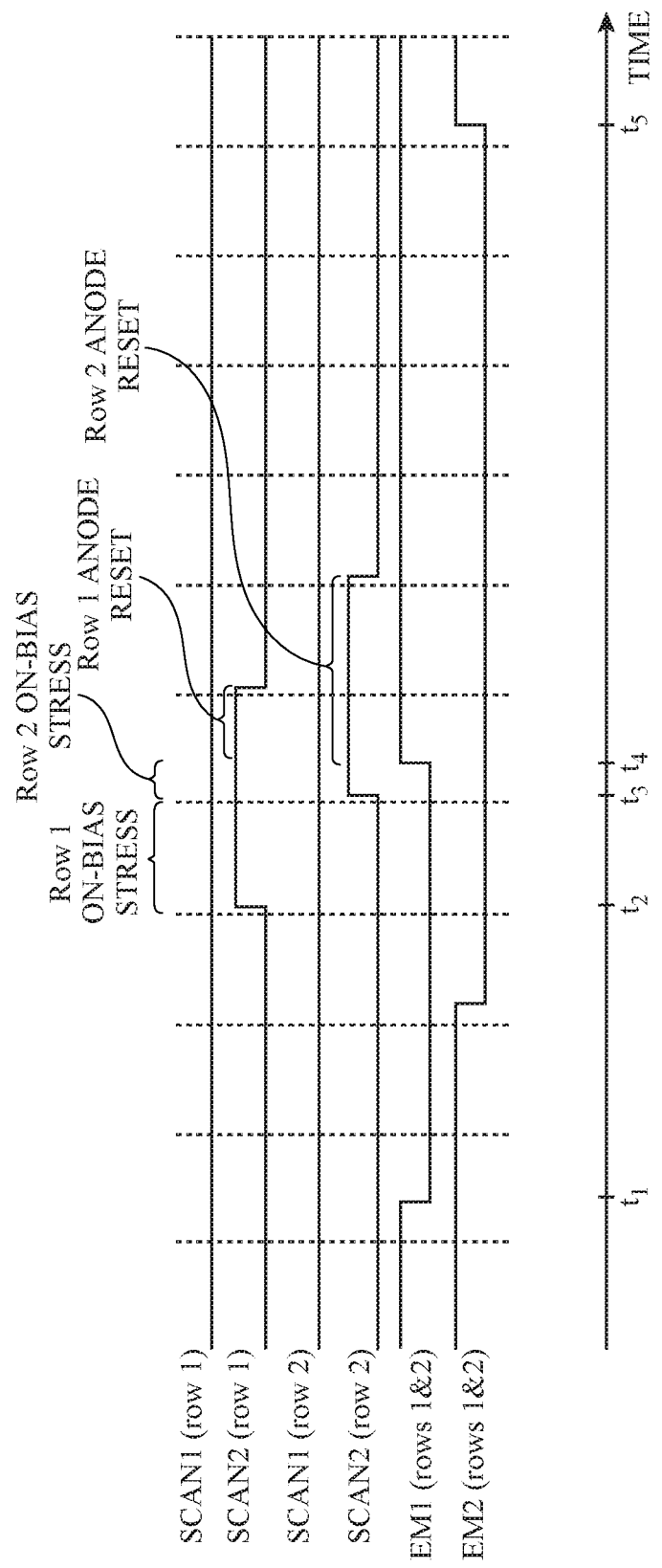
FIG. 19 is a timing diagram showing illustrative signals provided by the gate driver circuitry of FIG. 17 for an anode reset frame in accordance with an embodiment.

Signal waveforms that may be applied to display pixel 22 by the gate driver circuitry of FIG. 17 are shown in FIGS. 18 and 19. FIG. 18 shows a timing diagram for a refresh frame. In the example of FIGS. 17-19, the on-bias stress phase is included in the pixel operation.

As shown in FIG. 18, the EM1, and EM2 signals are provided to both rows 1 and 2 of the active area. In contrast, rows 1 and 2 receive unique Scan1 and Scan2 signals. Prior to time t1, signals Scan1 and Scan2 are deasserted (e.g., the scan control signals are both at low voltage levels), whereas signals EM1 and EM2 are asserted (e.g., the emission control signals are both at high voltage levels). When both emission control signals EM1 and EM2 are high, an emission current will flow through drive transistor T2 into the corresponding organic light-emitting diode 304 to produce light 306 (see FIG. 3).

At time t1, emission control signal EM1 for rows 1 and 2 is deasserted (i.e., driven low) to temporarily suspend the emission phase, which begins a data refresh or data programming phase. Signal Scan1 for row 1 may be pulsed high for a row 1 initialization phase. At t2, while Scan 1 for row 1 is deasserted, EM1 for rows 1 and 2 is deasserted, and EM2 for rows 1 and 2 is asserted, signal Scan1 for row 2 may be pulsed high for a row 2 initialization phase.

At time t3, while EM1, EM2, and Scan1 for row 1 are deasserted, signal Scan2 for row 1 may be asserted to begin the on-bias stress phase for row 1. Then at t4, while EM1, EM2, and Scan1 for row 2 are deasserted, signal Scan2 for row 2 may be asserted to begin the on-bias stress phase for row 2.

At time t5, scan control signal Scan1 for row 1 is pulsed high while signal Scan2 for row 1 is asserted and while signals EM1 and EM2 are both deasserted to load a desired data signal from data line 310 into display pixels 22 in row 1. At time t6, scan control signal Scan1 for row 2 is pulsed high while signal Scan2 for row 2 is asserted and while signals EM1 and EM2 are both deasserted to load a desired data signal from data line 310 into display pixels 22 in row 2. The emission phase then commences at t7 when emission control signals EM1 and EM2 are reasserted.

The same signal sequence will be repeated for rows 3 and 4, but with a delay for the signals to propagate through the shift register. Therefore, as shown in FIG. 18, the pixels may still operate effectively and implement an on-bias stress phase during the refresh frame even when the EM1 and EM2 drivers have register circuits shared between two rows of pixels.

FIG. 19 shows a timing diagram for an anode reset frame that is driven by the gate driver circuitry of FIG. 17. Prior to time t1, signals Scan1 (for both rows) and Scan2 (for both rows) are deasserted (e.g., the scan control signals are both at low voltage levels), whereas signals EM1 and EM2 are asserted (e.g., the emission control signals are both at high voltage levels). Scan1 for both row 1 and row 2 may remain at the low voltage level throughout the anode reset frame. When both emission control signals EM1 and EM2 are high, an emission current will flow through drive transistor T2 into the corresponding organic light-emitting diode 304 to produce light 306 (see FIG. 3).

At time t1, emission control signal EM1 is deasserted (i.e., driven low) to temporarily suspend the emission phase. Since on-bias stress is included during the data refresh frame of FIG. 18, on-bias stress may also be included during the anode reset frame of FIG. 19 to help maintain balance in terms of biasing the pixel transistors.

At time t2, while signal EM2 is deasserted, signal Scan2 (for row 1) is asserted. This marks the beginning of the on-bias stress phase for row 1. Then, at t3, signal Scan2 for row 2 is asserted, marking the beginning of the on-bias stress phase for row 2. At time t4, signal EM1 is asserted (e.g., EM1 is driven high) to turn on transistor T5, which marks the end of the on-bias stress phase for rows 1 and 2. Asserting signal EM1 at t4 also begins the anode reset phase for rows 1 and 2. The row 1 anode reset phase concludes when the Scan2 signal for row 1 is deasserted. The row 2 anode reset phase concludes when the Scan2 signal for row 2 is deasserted. At time t5, emission signals EM1 and EM2 are both high to resume the emission phase.

It should be noted that the pulse widths of the waveforms depicted in FIGS. 18 and 19 (or in FIGS. 11, 12, 15, and 16) may be tuned. The pulse widths may be tuned actively during operation of the display, may be tuned during a calibration procedure during manufacturing, etc. For example, the EM1 and EM2 pulse widths may be modified to mitigate any luminance artifacts during operation of the display, control the on-bias stress to maintain balance in biasing the pixel transistors, etc.

Figure 20:
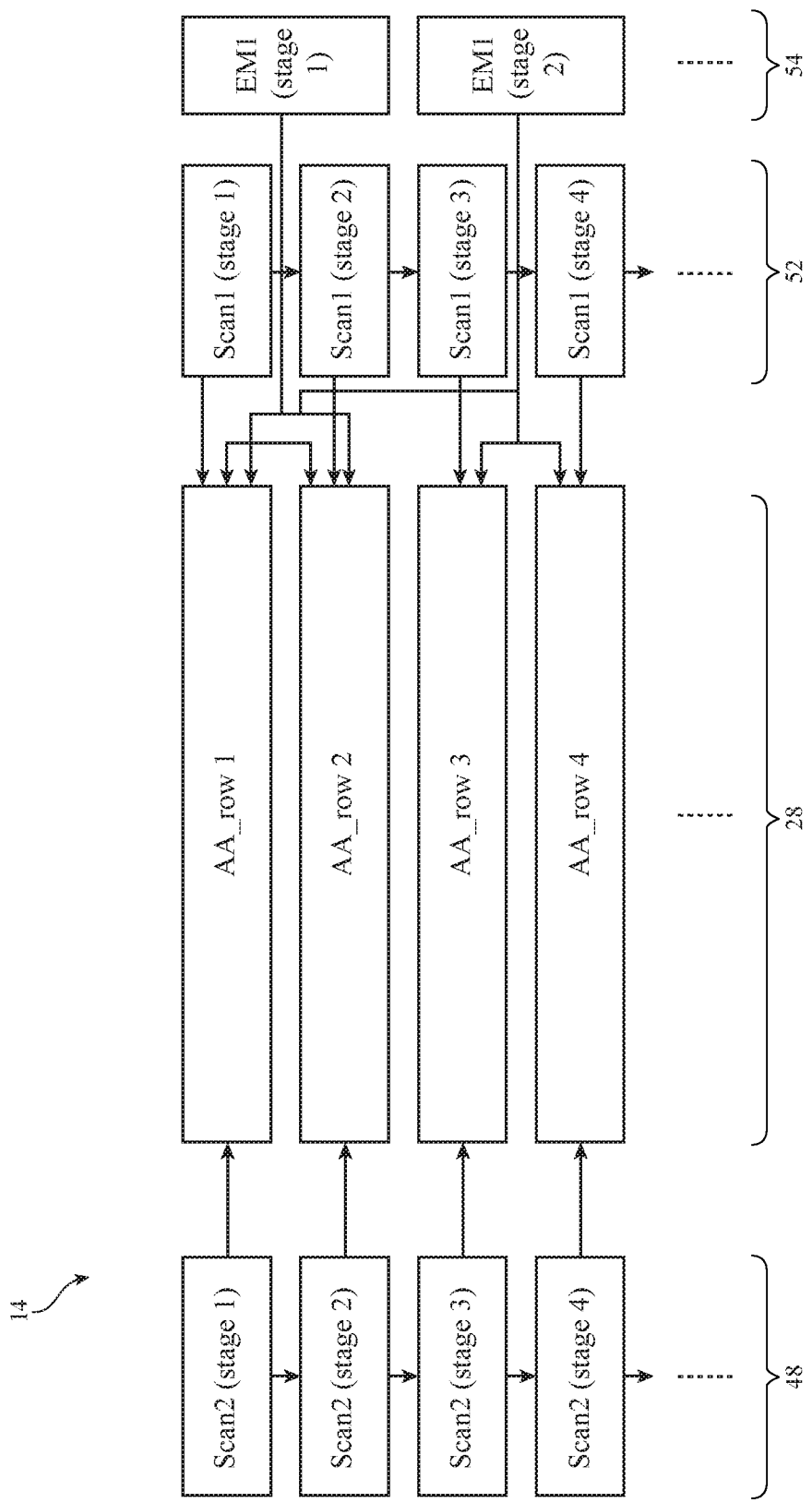
FIG. 20 is a schematic diagram of an illustrative display having first and second scan drivers with register circuits that each provide outputs to a single row and a single emission driver that provides first and second emission signals to the display pixels in accordance with an embodiment.

The concept of using a single emission driver to provide both the EM1 and EM2 emission signals (as shown in connection with FIGS. 14-16) may be applied to the gate driver scheme shown in FIGS. 17-19. An example of this type is shown in FIG. 20. As shown in FIG. 20, scan drivers 48 and 52 each include one register circuit for each row of pixels in the active area. Emission driver 54, similar to as in FIG. 17, has one register circuit for every two rows of pixels in the active area. Additionally, emission driver 50 is omitted and emission driver 54 provides both the EM1 and EM2 signals (similar to as shown in FIG. 14).

The waveforms of the EM1 and EM2 signals may be the same except for a shift in time relative to one another. Therefore, a single shift register may be used to provide both the EM1 and EM2 signals. As shown in FIG. 20, emission driver 54 may have a first stage that provides an output signal to both rows 1 and 2. The output signal serves as EM1 for rows 1 and 2 (e.g., the output signal is provided to terminal 314 of FIG. 3). The output signal is also provided to the second stage of the EM1 shift register. Stage 2 then provides the output signal to rows 3 and 4 to serve as EM1 for rows 3 and 4. However, stage 2 also provides the output signal back to rows 1 and 2 to serve as EM2 for rows 1 and 2. In other words, the output of stage 2 is coupled both to terminal 314 of the pixels in rows 3 and 4 to serve as EM1 for rows 3 and 4 and to terminal 315 of the pixels in rows 1 and 2 to serve as EM2 for the two previous rows (rows 1 and 2). Because EM1 and EM2 have the same waveform during operation of the pixels, the operation of the pixel will not be affected by using just one emission driver for both the EM1 and EM2 signals.

Operation of the pixels by the driver circuitry of FIG. 20 during the refresh frames and the anode reset frames may be the same as shown in FIGS. 18 and 19, with the EM1 and EM2 waveform having the same shape. The pixels may operate effectively during both the anode reset frames and the refresh frames even when a single emission driver provides both the EM1 and EM2 signals.

It should be understood that the positions of the drivers and the corresponding register circuits in FIGS. 10, 13, 14, 17, and 20 are merely illustrative. In general, each driver may be positioned on either side of the display. Each driver may have any desired position relative to the other drivers. In the embodiments shown herein, drivers are formed on first and second opposing sides of the active area. However, this is not required, and if desired all of the drivers may be formed on one side of the active area of the display. Any of the shift registers shown in FIGS. 10, 13, 14, 17, and 20 may be split across the active area as shown and discussed in connection with FIG. 14.

The foregoing is merely illustrative and various modifications can be made by those skilled in the art without departing from the scope and spirit of the described embodiments. The foregoing embodiments may be implemented individually or in any combination.

What is claimed is:

1. A display comprising:
    an array of pixels in an active area of the display, wherein the array of pixels comprises rows and columns of pixels;
    display driver circuitry in an inactive area of the display, wherein the display driver circuitry is configured to provide image data to the array of pixels; and
    gate driver circuitry in the inactive area of the display, wherein the gate driver circuitry is configured to provide control signals to the array of pixels, wherein the gate driver circuitry comprises a scan driver that includes a first shift register formed by a plurality of first register circuits, wherein each one of the first register circuits outputs a scan control signal to a respective single row of pixels, wherein the gate driver circuitry comprises an emission driver that includes a second shift register formed by a plurality of second register circuits, wherein each one of the second register circuits outputs an emission control signal to at least two respective rows of pixels, wherein the scan driver is a second scan driver, wherein the emission driver is a first emission driver, wherein the scan control signal is a second scan control signal, wherein the emission control signal is a first emission control signal, wherein the gate driver circuitry comprises a first scan driver that includes a third shift register formed by a plurality of third register circuits, wherein the gate driver circuitry comprises a second emission driver that includes a fourth shift register formed by a plurality of fourth register circuits, wherein each one of the third register circuits outputs a first scan control signal to at least two respective rows of pixels, and wherein each one of the fourth register circuits outputs a second emission control signal to at least two respective rows of pixels.

2. The display defined in claim 1, wherein the gate driver circuitry is configured to operate first and second rows of pixels during a refresh frame and wherein the gate driver circuitry is configured to, during the refresh frame:
deassert the first emission control signal and assert the first scan control signal to stop an emission phase for the first and second rows and begin an initialization phase for the first and second rows;
deassert the second emission control signal and assert the second scan control signal for the first row to perform data writing for the first row;
after asserting the second scan control signal for the first row to perform data writing for the first row, assert the second scan control signal for the second row to perform data writing for the second row; and
assert the first and second emission control signals for the first and second rows to resume the emission phase.

3. The display defined in claim 2, wherein the gate driver circuitry is configured to operate the first and second rows of pixels during an anode reset frame and wherein the gate driver circuitry is configured to, during the anode reset frame:
assert the first and second emission control signals and deassert the first and second scan control signals during an additional emission phase;
deassert the second emission control signal to stop the additional emission phase for the first and second rows;
assert the second scan control signal for the first row in a first row anode reset phase;
assert the second scan control signal for the second row in a second row anode reset phase; and
assert the second emission control signal to resume the additional emission phase.

4. The display defined in claim 1, wherein the active area of the display has first and second opposing sides connected by third and fourth opposing sides, wherein the first scan driver scans the pixels in the active area from the first side to the second side of the active area, wherein the first scan driver has at least one register circuit on the third side of the active area, and wherein the first scan driver has at least one register circuit on the fourth side of the active area.

5. A display comprising:
an array of pixels in an active area of the display, wherein the array of pixels comprises first and second rows of pixels and wherein each pixel in the array of pixels has:
a first emission transistor, a drive transistor, a second emission transistor, and a light-emitting diode coupled in series between a first power supply terminal and a second power supply terminal;
a capacitor coupled to a gate of the drive transistor;
a semiconducting-oxide switching transistor that is coupled to the gate of the drive transistor, wherein a gate of the semiconducting-oxide switching transistor is configured to receive a first scan control signal; and
a silicon switching transistor that is coupled between the drive transistor and a data line, wherein a gate of the silicon switching transistor is configured to receive a second scan control signal;
display driver circuitry in an inactive area of the display, wherein the display driver circuitry is configured to provide image data to the pixels; and
gate driver circuitry in the inactive area of the display, wherein the gate driver circuitry comprises:
a first register circuit that provides the first scan control signal to the pixels in the first and second rows of pixels; and
a second register circuit that provides the second scan control signal to the pixels in the first row of pixels.

6. The display defined in claim 5, wherein the first register circuit is part of a first shift register that includes a first plurality of register circuits, wherein each register circuit in the first plurality of register circuits provides the first scan control signal to at least two respective rows of pixels, wherein the second register circuit is part of a second shift register that includes a second plurality of register circuits, and wherein each register circuit in the second plurality of register circuits provides the second scan control signal to the pixels in a respective single row of pixels.

7. The display defined in claim 6, wherein the first shift register receives clock signals at a first frequency and wherein the second shift register receives clock signals at a second frequency that is different than the first frequency.

8. A display comprising:
an array of pixels in an active area of the display, wherein the active area of the display has first and second opposing sides connected by third and fourth opposing sides;
display driver circuitry in an inactive area of the display, wherein the display driver circuitry is configured to provide image data to the pixels; and
gate driver circuitry in the inactive area of the display that provides control signals to the array of pixels, wherein the gate driver circuitry comprises a shift register formed by a chain of register circuits that are configured to provide control signals to the array of pixels, wherein the shift register scans the array of pixels from the first side of the active area to the second side of the active area, and wherein the chain of register circuits includes at least one register circuit on a third side of the active area and at least one register circuit on a fourth side of the active area.

9. The display defined in claim 8, wherein the gate driver circuitry comprises an additional shift register formed by an additional chain of register circuits that are configured to provide additional control signals to the array of pixels, wherein the additional shift register scans the array of pixels from the first side of the active area to the second side of the active area, and wherein the additional chain of register circuits includes at least one register circuit on the third side of the active area and at least one register circuit on the fourth side of the active area.

10. The display defined in claim 8, wherein the at least one register circuit on the third side of the active area propagates a control pulse to the at least one register circuit on the fourth side of the active area.

11. A display comprising:
an array of pixels in an active area of the display, wherein the array of pixels comprises first and second adjacent rows of pixels and wherein each pixel in the array of pixels comprises a plurality of transistors;
display driver circuitry in an inactive area of the display, wherein the display driver circuitry is configured to provide image data to the pixels; and
gate driver circuitry in the inactive area of the display, wherein the gate driver circuitry comprises a shift register that includes a plurality of register circuits and wherein each register circuit of the plurality of register circuits is configured to provide a control signal to both a first transistor of the plurality of transistors in the first row of pixels and a second, different transistor of the plurality of transistors in the second row of pixels.

12. The display defined in claim 11, wherein the plurality of transistors of each pixel comprises at least one silicon transistor and at least one semiconducting-oxide transistor.

13. The display defined in claim 11, wherein each pixel in the array of pixels comprises:
   a first emission transistor, drive transistor, a second emission transistor, and light-emitting diode coupled in series between a first power supply terminal and a second power supply terminal.

14. The display defined in claim 13, wherein each pixel in the array of pixels comprises:
   a capacitor coupled to a gate of the drive transistor.

15. The display defined in claim 14, wherein each pixel in the array of pixels comprises:
   a semiconducting-oxide switching transistor,
   wherein the semiconducting-oxide switching transistor is coupled to the gate of the drive transistor.

16. The display defined in claim 15, wherein each pixel in the array of pixels comprises:
   a silicon switching transistor, wherein the silicon switching transistor is coupled between the drive transistor and a data line.

* * * * *